(12) United States Patent  (10) Patent No.: US 8,791,542 B2
Toriyama et al.  (45) Date of Patent: Jul. 29, 2014

(54) SOLID-STATE IMAGING DEVICE

(71) Applicants: Shuichi Toriyama, Kanagawa (JP);
Koichi Kokubun, Kanagawa (JP);
Hiroki Sasaki, Kanagawa (JP)

(72) Inventors: Shuichi Toriyama, Kanagawa (JP);
Koichi Kokubun, Kanagawa (JP);
Hiroki Sasaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 13/729,140

(22) Filed: Dec. 28, 2012

(65) Prior Publication Data
US 2013/0248865 A1 Sep. 26, 2013

(30) Foreign Application Priority Data
Mar. 23, 2012 (JP) ................. 2012-067661

(51) Int. Cl.
*H01L 31/06* (2012.01)
*H01L 27/146* (2006.01)
*H01L 31/109* (2006.01)
*H01L 31/105* (2006.01)

(52) U.S. Cl.
CPC ...... *H01L 31/1055* (2013.01); *H01L 27/14643* (2013.01); *H01L 31/109* (2013.01); *H01L 27/1461* (2013.01)
USPC ....... 257/461; 257/184; 257/191; 257/E27.13

(58) Field of Classification Search
USPC ................. 257/461, 463, 191, 611
See application file for complete search history.

(56) References Cited

U.S. PATENT DOCUMENTS

| | | | |
|---|---|---|---|
| 6,518,638 B1 * | 2/2003 | Kuhara et al. | 257/431 |
| 6,885,075 B2 * | 4/2005 | Kuhara et al. | 257/431 |
| 2003/0116814 A1 * | 6/2003 | Kuhara et al. | 257/431 |
| 2013/0248865 A1 * | 9/2013 | Toriyama et al. | 257/53 |

FOREIGN PATENT DOCUMENTS

| | | |
|---|---|---|
| JP | 2003-163361 | 6/2003 |
| JP | 2008-103667 | 5/2008 |

OTHER PUBLICATIONS

Notice of Rejection issued by the Japanese Patent Office on Apr. 30, 20141, in counterpart Japanese Patent Application No. 2012-067661.

* cited by examiner

*Primary Examiner* — Earl Taylor
(74) *Attorney, Agent, or Firm* — Finnegan, Henderson, Farabow, Garrett & Dunner, L.L.P.

(57) ABSTRACT

According to an embodiment, a solid-state imaging device includes a photoelectric, conversion element. The photoelectric conversion element includes a first semiconductor layer, a second semiconductor layer, and a third semiconductor layer. In the solid-state imaging device, $D_{2m3}/L_{2m3} \times n_{i3}^2/N_2 < D_{1M2}/L_{1M2} \times n_{i2}^2/N_2$ and $D_{1m1}/L_{1m1} \times n_{i1}^2/N_1 < D_{1m2}/L_{1m2} \times n_{i2}^2/N_1$ are established.

11 Claims, 25 Drawing Sheets

FIG.1
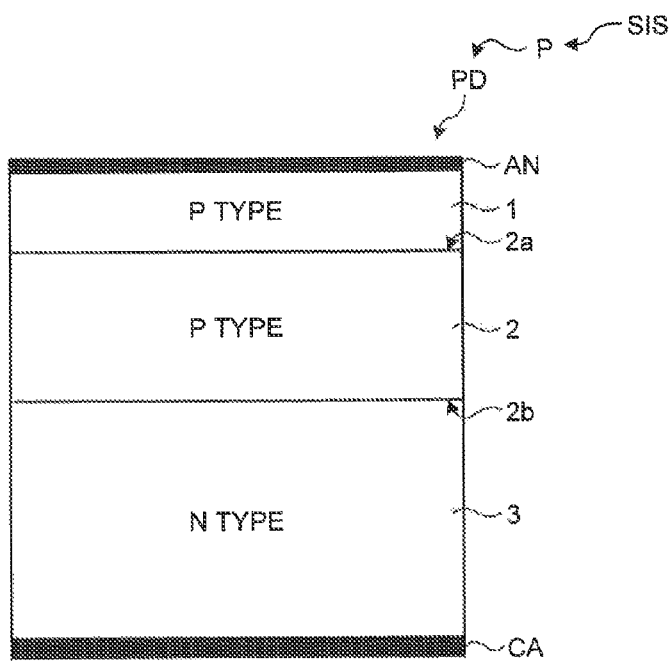
INCIDENT LIGHT
$$\frac{D_{p3}}{L_{p3}}\frac{n_{i3}^2}{N_D} < \frac{D_{p2}}{L_{p2}}\frac{n_{i2}^2}{N_D} \text{ AND } \frac{D_{n1}}{L_{n1}}\frac{n_{i1}^2}{N_A} < \frac{D_{n2}}{L_{n2}}\frac{n_{i2}^2}{N_A}$$
OR
$$\sqrt{\mu_{p3}}\frac{n_{i3}^2}{N_D} < \sqrt{\mu_{p2}}\frac{n_{i2}^2}{N_D} \text{ AND } \sqrt{\mu_{n1}}\frac{n_{i1}^2}{N_A} < \sqrt{\mu_{n2}}\frac{n_{i2}^2}{N_A}$$

| STRUCTURE | Na [cm^-3] | t_barrier [μm] | Nasigma [μm] |
|---|---|---|---|
| STRUCTURE CA | 1.00E+19 | 0.1 | 0.05 |
| STRUCTURE CB | | 0.2 | 0.1 |
| STRUCTURE CC | | 0.3 | 0.15 |
| STRUCTURE AA | 1.00E+19 | #N/A | 0.05 |
| STRUCTURE AB | | | 0.1 |
| STRUCTURE AC | | | 0.15 |
| STRUCTURE BA | 1.00E+19 | #N/A | 0.05 |
| STRUCTURE BB | | | 0.1 |
| STRUCTURE BC | | | 0.15 |
| STRUCTURE DA | 1.00E+20 | 0.1 | UNIFORM IN BARRIER |
| STRUCTURE DB | | 0.2 | |
| STRUCTURE DC | | 0.3 | |

| ID | Nd [cm^-3] | Ndz [μm] | Nasigma [μm] |
|---|---|---|---|
| 1 | -1.00E+17 | -1.6 | 0.6 |
| 2 | | | 0.8 |
| 3 | | | 1 |
| 4 | | -1.2 | 0.6 |
| 5 | | | 0.8 |
| 6 | | | 1 |
| 7 | | -0.8 | 0.6 |
| 8 | | | 0.8 |
| 9 | | | 1 |
| 10 | -3.00E+17 | -1.6 | 0.6 |
| 11 | | | 0.8 |
| 12 | | | 1 |
| 13 | | -1.2 | 0.6 |
| 14 | | | 0.8 |
| 15 | | | 1 |
| 16 | | -0.8 | 0.6 |
| 17 | | | 0.8 |
| 18 | | | 1 |
| 19 | -1.00E+18 | -1.6 | 0.6 |
| 20 | | | 0.8 |
| 21 | | | 1 |
| 22 | | -1.2 | 0.6 |
| 23 | | | 0.8 |
| 24 | | | 1 |
| 25 | | -0.8 | 0.6 |
| 26 | | | 0.8 |
| 27 | | | 1 |

FIG.9A

TABLE. RELATIONSHIP OF PRODUCT ON ANODE SIDE

| STRUCTURE | $Na@z=0$ $[cm^{-3}]$ | $ni@z=0$ $[cm^{-3}]$ | $\mu @z=0$ $[cm^2/Vsec]$ | PRODUCT AT ANODE $\sqrt{(\mu n)} \times ni^2/Na$ |
|---|---|---|---|---|
| A | 1.00E+19 | 1.00E+13 | 200 | 1.41E+08 |
| B | 1.00E+19 | 5.00E+11 | 100 | 2.50E+05 |
| C = EXAMPLE 2 | 1.00E+19 | 5.00E+11 | 100 | 2.50E+05 |
| D = EXAMPLE 1 | 1.00E+20 | 1.00E+12 | 1 | 1.00E+04 |
| E | 1.00E+20 | 1.00E+12 | 100 | 1.00E+05 |

FIG.9B

TABLE. RELATIONSHIP OF PRODUCT ON CATHODE SIDE

| STRUCTURE | $Nd@z=END$ $[cm^{-3}]$ | $ni@z=END$ $[cm^{-3}]$ | $\mu @z=END$ $[cm^2/Vsec]$ | PRODUCT AT CATHODE $\sqrt{(\mu p)} \times ni^2/Nd$ |
|---|---|---|---|---|
| A | 1.00E+16 | 1.00E+11 | 200 | 1.41E+07 |
| B | 1.00E+16 | 1.00E+11 | 200 | 1.41E+07 |
| C = EXAMPLE 2 | 1.00E+16 | 1.00E+11 | 200 | 1.41E+07 |
| D = EXAMPLE 2 | 1.00E+16 | 1.00E+11 | 200 | 1.41E+07 |
| E | 1.00E+16 | 1.00E+11 | 200 | 1.41E+07 |
| cf. WHEN SUBSTRATE IS MADE OF SiGe = WHEN IT IS ASSUMED THAT REGION 2 IS DIRECTLY ATTACHED TO CATHODE ELECTRODE | 1.00E+16 | 1.00E+13 | 900 | 3.00E+11 |

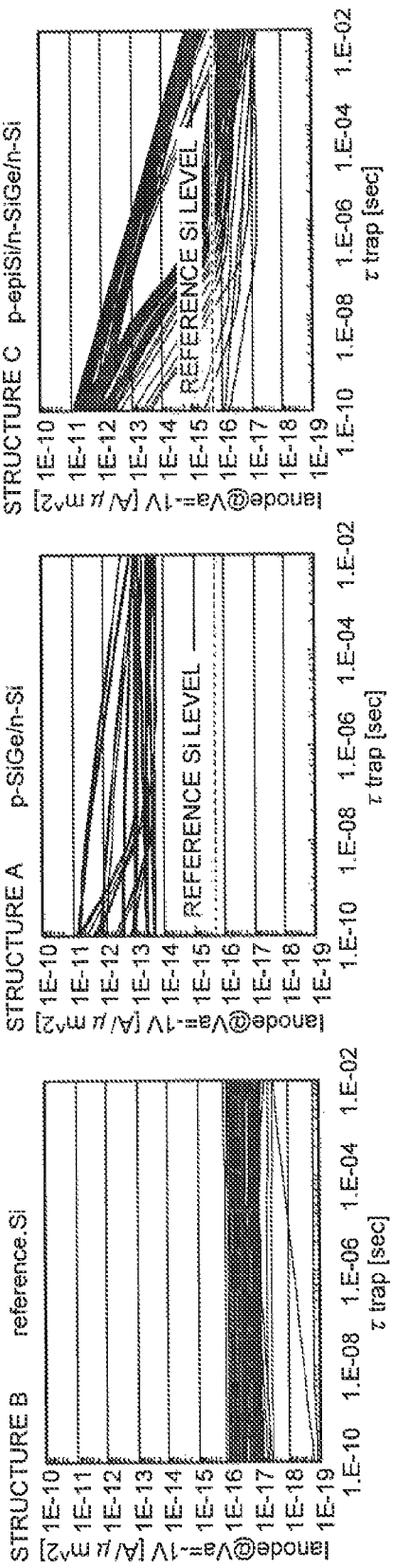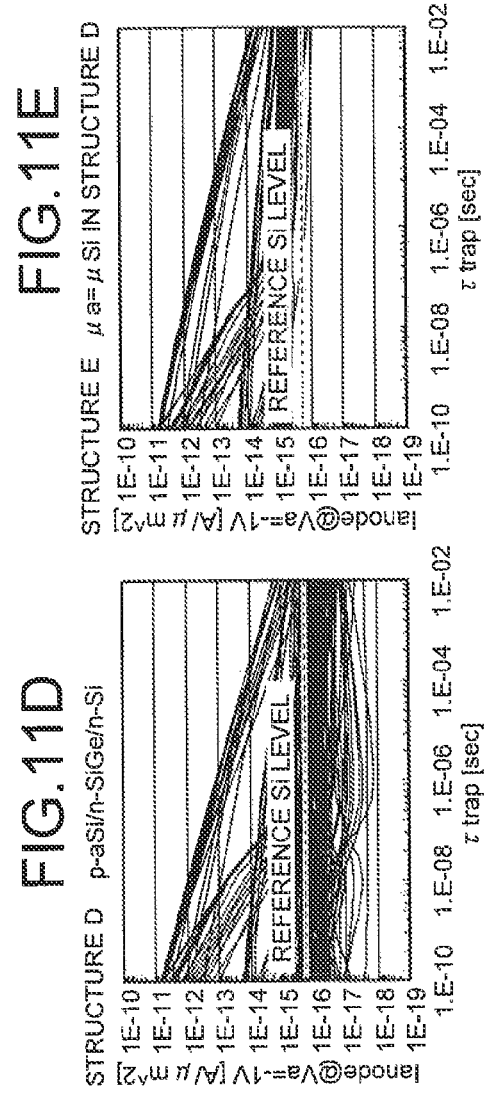

INCIDENT LIGHT

INCIDENT LIGHT

FIG.17

| BULK MOBILITY [cm^2/Vsec] | THERMOELECTROMOTIVE FORCE kBT/q [V] | L [nm] | DESCRIPTION |
|---|---|---|---|
| 1450 | 0.021 | 55.15 | IT IS ASSUMED THAT ELECTRON OF Si IS USED AND T IS 243 K |
| 1450 | 0.031 | 66.94 | IT IS ASSUMED THAT ELECTRON OF Si IS USED AND T IS 358 K |
| 1450 | 0.026 | 61.28 | IT IS ASSUMED THAT ELECTRON OF Si IS USED AND T IS 300 K |
| 1 | 0.031 | 1.76 | IT IS ASSUMED THAT ELECTRON OF a-Si IS USED AND T IS 358 K |
| 3900 | 0.031 | 109.79 | IT IS ASSUMED THAT ELECTRON OF Ge IS USED AND T IS 358 K |
| 400 | 0.031 | 35.16 | IT IS ASSUMED THAT ELECTRON OF 4H-SiC IS USED AND T IS 358 K |

FIG.18

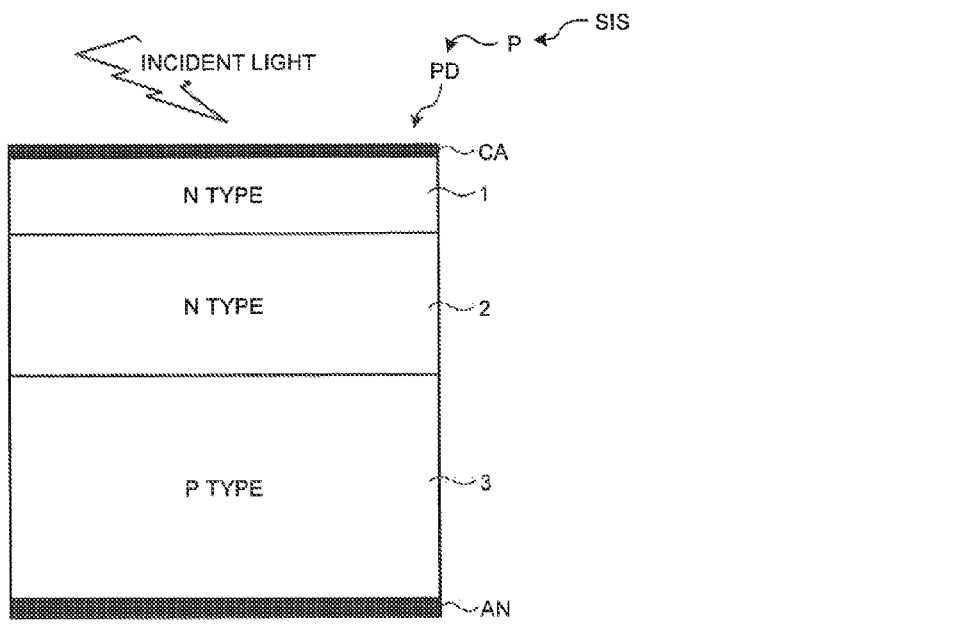

$$\frac{D_{n3}}{L_{n3}} \frac{n_{i3}^2}{N} < \frac{D_{n2}}{L_{n2}} \frac{n_{i2}^2}{N} \quad \text{AND} \quad \frac{D_{p1}}{L_{p1}} \frac{n_{i1}^2}{N} < \frac{D_{p2}}{L_{p2}} \frac{n_{i2}^2}{N}$$

OR $$\sqrt{\mu_{n3}} \frac{n_{i3}^2}{N} < \sqrt{\mu_{n2}} \frac{n_{i2}^2}{N} \quad \text{AND} \quad \sqrt{\mu_{p1}} \frac{n_{i1}^2}{N} < \sqrt{\mu_{p2}} \frac{n_{i2}^2}{N}$$

FIG.25A
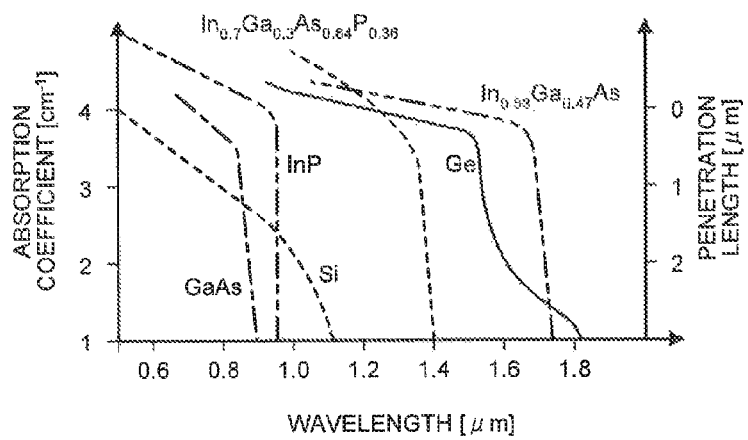
FIG.25B
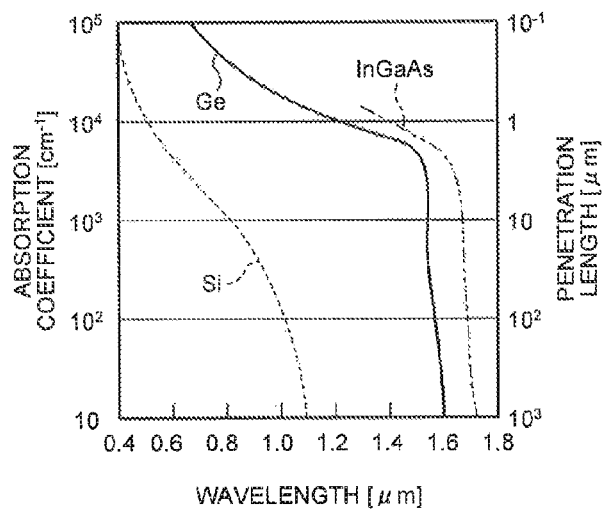
FIG.25C
| | Eg [eV] | ABSORPTION END BASED ON Eg [nm] | $\mu n$ [cm^2/Vsec] | $\mu p$ [cm^2/Vsec] | BAND STRUCTURE |
|---|---|---|---|---|---|
| Si | 1.12 | 1107.14 | 1450 | 450 | INDIRECT |
| Ge | 0.66 | 1878.79 | 3900 | 1900 | INDIRECT |
| SiGe | VALUE BETWEEN Si AND Ge IS OBTAINED DEPENDING ON Ge FRACTION | | | | |
| InxGa1-xAs | 0.4-1.4 | 3100-885 | #N/A | #N/A | DIRECT |
| InSb | 0.17 | 7294.12 | 80000 | 1250 | DIRECT |
| GaAs | 1.42 | 873.24 | 8500 | 400 | DIRECT |
| InP | 1.35 | 918.52 | 4600 | 150 | DIRECT |
| 6H-SiC | 3.08 | 402.60 | 400 | 50 | INDIRECT |

US 8,791,542 B2

SOLID-STATE IMAGING DEVICE

CROSS-REFERENCE TO RELATED APPLICATIONS

This application is based upon and claims the benefit of priority from Japanese Patent Application No. 2012-057661, filed on Mar. 23, 2012; the entire contents of which are incorporated herein by reference.

FIELD

Embodiments described herein relate generally to a solid-state imaging device.

BACKGROUND

In a solid-state imaging device, each of a plurality of photoelectric conversion elements generates and accumulates an electrical charge according to light intensity of incident light. Then, the accumulated charges are read from the plurality of photoelectric conversion elements to obtain image signals. In this case, in order to improve the quality of an image formed by the image signals, it is desirable to improve photoelectric conversion efficiency and reduce a dark current in each photoelectric conversion element.

BRIEF DESCRIPTION OF THE DRAWINGS

FIG. 1 is a diagram illustrating the structure of a photoelectric conversion element according to an embodiment;

FIGS. 9A and 9B are tables of the comparison between the magnitudes of "the product of minority carrier terms D/L ($\propto \sqrt{(\mu)}$) and $n_i^2/N_{dope}$";

FIGS. 11A to 11E are diagrams when viewing FIGS. 10A to 10D from another side;

FIG. 17 is a diagram illustrating the structure of a photoelectric, conversion element according to another modification of the embodiment;

FIG. 18 is a diagram illustrating the structure of a photoelectric conversion element according to another modification of the embodiment;

FIGS. 25A to 25C are diagrams illustrating the relation among the wavelength, absorption coefficient, and penetration length of light;

DETAILED DESCRIPTION

Figure 2:
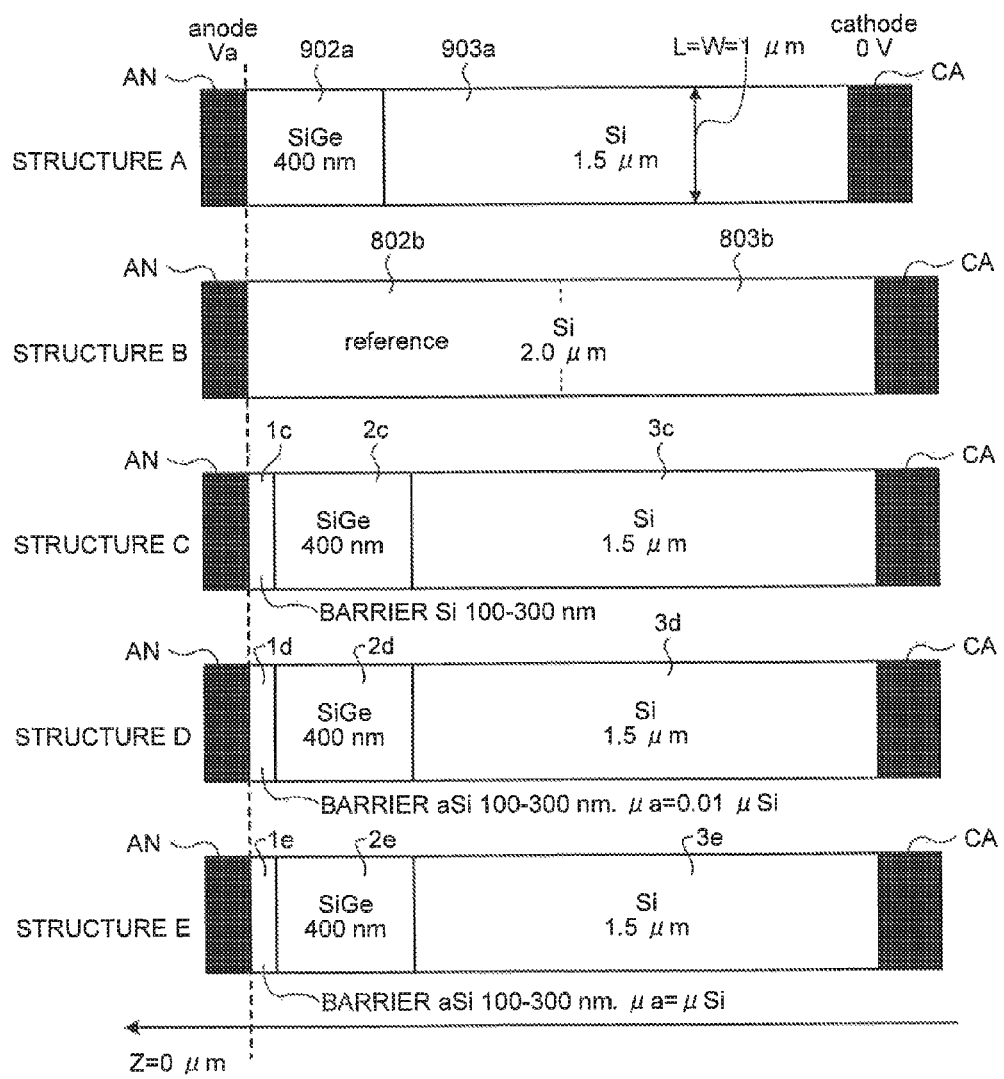
FIG. 2 is a diagram illustrating the structures of photoelectric conversion elements according to the embodiment and comparative examples.

According to an embodiment, a solid-state imaging device includes a photoelectric converter. The photoelectric converter includes a first semiconductor layer of a first conductivity type; a second semiconductor layer of the first conductivity type that is provided adjacent to the first semiconductor layer; and a third semiconductor layer of a second conductivity type opposite to the first conductivity type that is provided adjacent to the second semiconductor layer. The second semiconductor layer is formed of a material with an absorption coefficient for visible light greater than that of a material forming the third semiconductor layer. A relation of $D_{2m3}/L_{2m3} \times n_{i3}^2/N_2 < D_{1M2}/L_{1M2} \times n_{i2}^2/N_2$ and a relation of $D_{1m1}/L_{1m1} \times n_{i1}^2/N_1 < D_{1m2}/L_{1m2} \times n_{i2}^2/N_1$ are established, where a diffusion coefficient of a minority carrier in the first semiconductor layer is $D_{1m1}$, a diffusion length of the minority carrier in the first semiconductor layer is $L_{1m1}$, an intrinsic carrier concentration in the first semiconductor layer is $n_{i1}$, a dopant concentration in the first semiconductor layer is $N_1$, a diffusion coefficient of the minority carrier in the second semiconductor layer is $D_{1m2}$, a diffusion coefficient of a majority carrier in the second semiconductor layer is $D_{1M2}$, a diffusion length of the minority carrier in the second semiconductor layer is $L_{1m2}$, a diffusion length of the majority carrier in the second semiconductor layer is $L_{1M2}$, an intrinsic carrier concentration in the second semiconductor layer is $n_{i2}$, a diffusion coefficient of the minority carrier in the third semiconductor layer is $D_{2m3}$, a diffusion length of the minority carrier in the third semiconductor layer is $L_{2m3}$, an intrinsic carrier concentration in the third semiconductor layer is $n_{i3}$, and a dopant concentration in the third semiconductor layer is $N_2$.

A solid-state imaging device according to an embodiment will be described in detail with reference to the accompanying drawings. The invention is not limited to the embodiment.

A solid-state imaging device SIS according to an embodiment will be described.

The solid-state imaging device SIS is, for example, a CMOS image sensor or a CCD image sensor. In the solid-state imaging device SIS, a plurality of pixels is one-dimensionally or two-dimensionally arranged. Each of the plurality of pixels includes a photoelectric conversion element. That is, in the solid-state imaging device SIS, each of the plurality of photoelectric conversion elements performs photoelectric conversion so as to generate and accumulate an electrical charge corresponding to light intensity of incident light. The accumulated charges are read from the plurality of photoelectric conversion elements, thereby obtaining an image signal. In this case, in order to improve the quality of an image obtained by the image signal, it is desirable to improve the photoelectric conversion efficiency of each photoelectric conversion element and reduce a dark current in each photoelectric conversion element.

Figure 28:
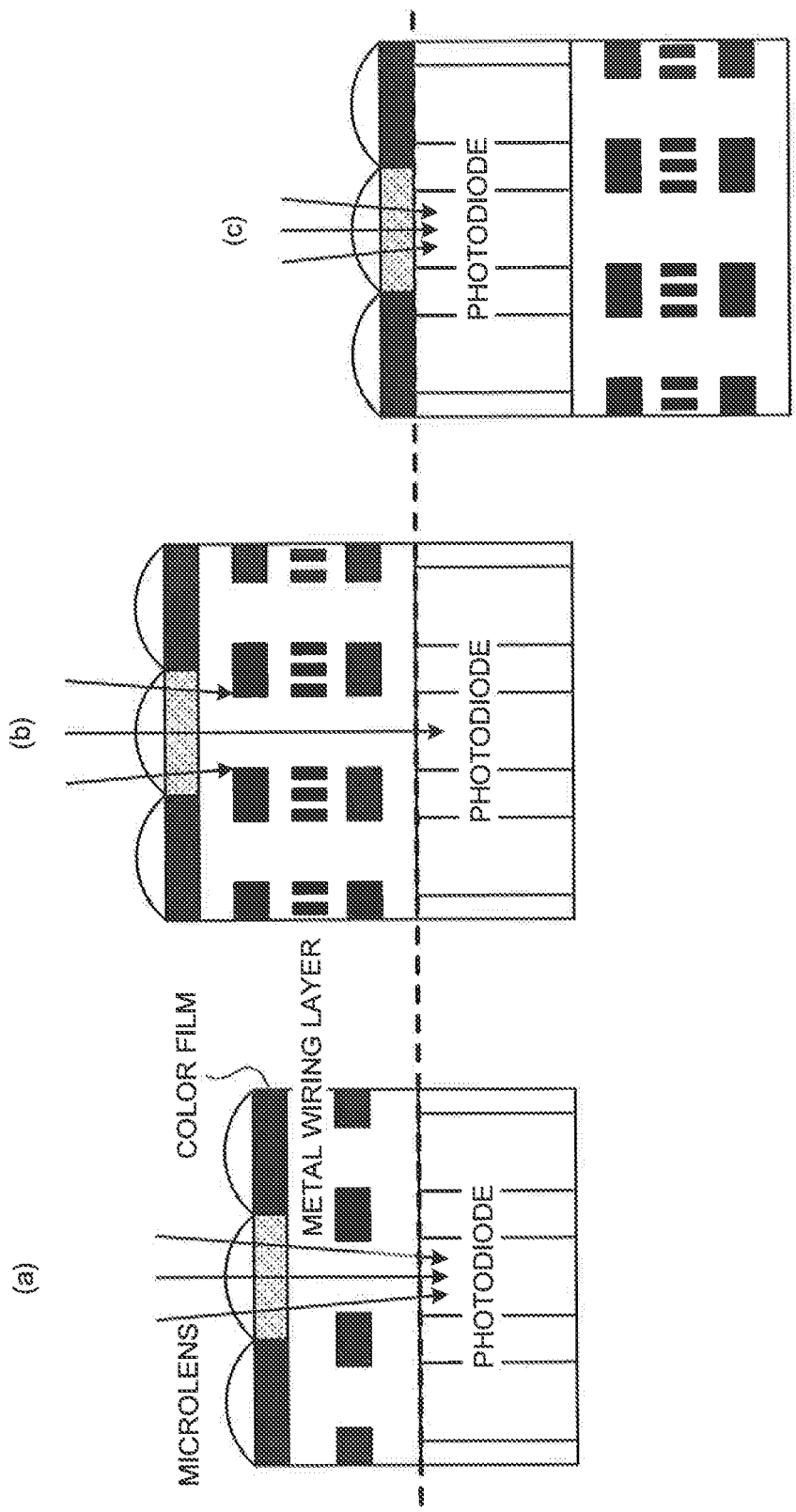
FIG. 28 is a diagram illustrating the basic structures of three types of the solid-state imaging device.

Meanwhile, as the basic structure of the solid-state imaging device SIS, for example, a CCD image sensor of a type (a) illustrated in FIG. 28 was mainly used by around 2004, and a front side illumination (FSI) CMOS image sensor of a type (b) illustrated in FIG. 28 in which light enters a semiconductor substrate from the front side thereof was mainly used from around 2004 to 2009. In recent years, a back side illumination (BSI) CMOS image sensor of a type (c) illustrated in FIG. 28 has drawn attention in which light enters the semiconductor substrate from the rear side thereof so that incident light can be received without being hindered by wirings, with a reduction in the size of pixels and a reduction in the number of incident photons per pixel. In all of the basic: structures of the solid-state imaging devices illustrated in FIG. 28 (even when there is a difference in charge transmission structure between the CMOS image sensor and the CCD image sensor), the photoelectric conversion elements have the same structure, and the same function is required for the photoelectric conversion elements. In addition, it is desirable to improve the photoelectric conversion efficiency of each photoelectric conversion element and reduce the dark current thereof. Next, an example in which the basic structure of the solid-state imaging device is the back side illumination (BSI) CMOS image sensor (see the type (c) of FIG. 28) will foe described. However, this embodiment can also be applied to other basic structures of the solid-state imaging device.

As each photoelectric, conversion element of the solid-state imaging device, for example, a photodiode is exemplified in which a p-type semiconductor layer and an n-type semiconductor layer are joined together and photoelectric conversion is performed in the vicinity of a PN junction interface. As the photodiode, a PN junction diode made of Si is mainly used.

Figure 24A:
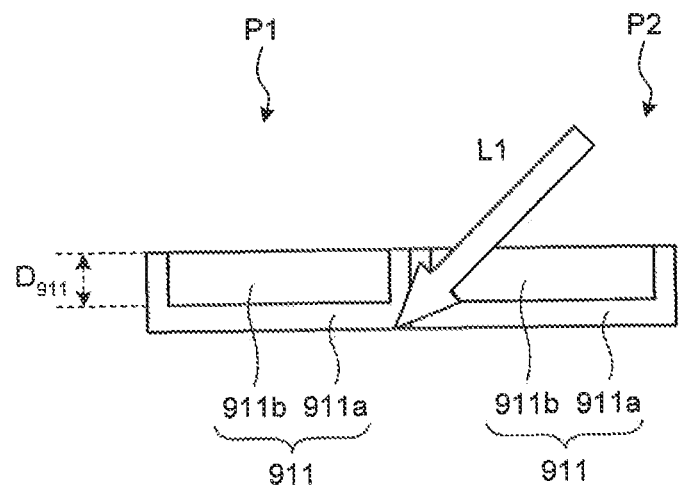
FIGS. 24A and 24B are diagrams illustrating color mixture.
Figure 24B:
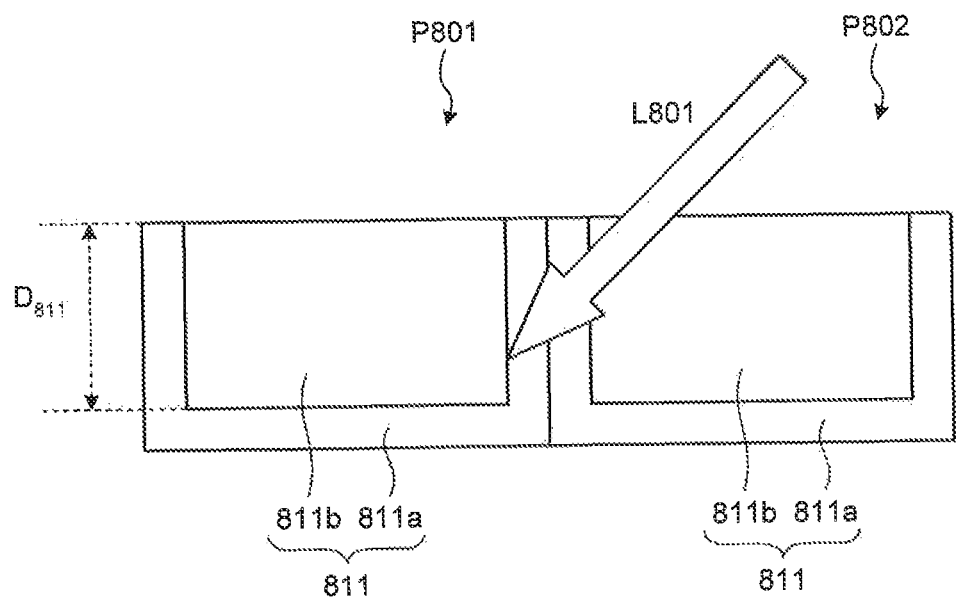

In recent years, the size of the pixel has been reduced in order to meet a demand for a high-resolution solid-state imaging device SIS. The gap between the photodiodes forming the pixels tends to be smaller, with a reduction in the size of the pixel. With the reduction in the size of the pixel, an increase in noise due to the color mixture between adjacent pixels due to obliquely incident light is a serious problem. For example, as illustrated in FIG. 24B, obliquely incident light L801 which enters a pixel 802 adjacent to a pixel P801 passes through a semiconductor region 811b of a photodiode 811 of the adjacent pixel P802 and reaches the semiconductor region 811b of the photodiode 811 of the pixel P801. Therefore, the color mixture between the pixels P801 and P802 due to the obliquely incident light is likely to occur. That is, it is difficult to prevent the color mixture between adjacent pixels due to the obliquely incident light.

In order to prevent the color mixture, it is considered to reduce the thickness of the photodiode from geometric considerations. For example, as illustrated in FIG. 24A, when the thickness $D_{911}$ of a semiconductor region 911b in a photodiode 911 is less than the thickness D811 of the semiconductor region 811b in the photodiode 811, obliquely incident light L1 which enters a pixel P2 adjacent to a pixel P1 passes through the semiconductor region 911b of the photodiode 911 in the adjacent pixel P2, but does not reach the semiconductor region 911b of the photodiode 911 in the pixel P1. Therefore, color mixture between the pixels P1 and P2 due to obliquely incident light is less likely to occur. That is, it is possible to prevent color mixture between adjacent pixels due to obliquely incident light.

A reduction in the thickness of the photodiode means a reduction in the volume of a semiconductor for photoelectric conversion and may cause deterioration of photoelectric conversion characteristics. A photodiode which is entirely made of Si needs to have a thickness of about 3 µm to 4 µm, considering the penetration length of red light absorption. That is, a reduction in the thickness of the photodiode which is entirely made of Si is capable of solving the problem of color mixture, but causes deterioration of photoelectric conversion characteristics.

However, as illustrated in FIG. 25C, when band transition structures are the same (indirection transition or direct transition), a light absorption coefficient tends to increase as the bandgap Eg of a material is reduced. It is assumed that the use of this tendency makes it possible to reduce the thickness of the photodiode while maintaining the photoelectric conversion characteristics. That is, a high light absorption coefficient means that photoelectric conversion efficiency per unit film thickness is high. Therefore, it is assumed that it is possible to reduce the thickness of the photodiode while maintaining the photoelectric conversion efficiency at the same value as that in the conventional art (see FIGS. 25A and 25B). For example, as illustrated in FIG. 26B, in a photodiode PD900, in a case Id which a p-type semiconductor layer 902 and an n-type semiconductor layer 903 are joined together between an anode electrode AN and a cathode electrode CA, if the light absorption coefficient of a material (for example, $Si_{1-x}Ge_x$, $0<x\le1$; forming the p-type semiconductor layer 302 is greater than that of a material (for example, Si) forming the n-type semiconductor layer 903, it is possible to reduce the thickness of the photodiode capable of obtaining the same photoelectric conversion characteristics, as compared to when the entire photodiode PD800 is made of Si (when both a p-type semiconductor layer 802 and an n-type semiconductor layer 803 illustrated in FIG. 26A are made of Si).

Figure 26A:
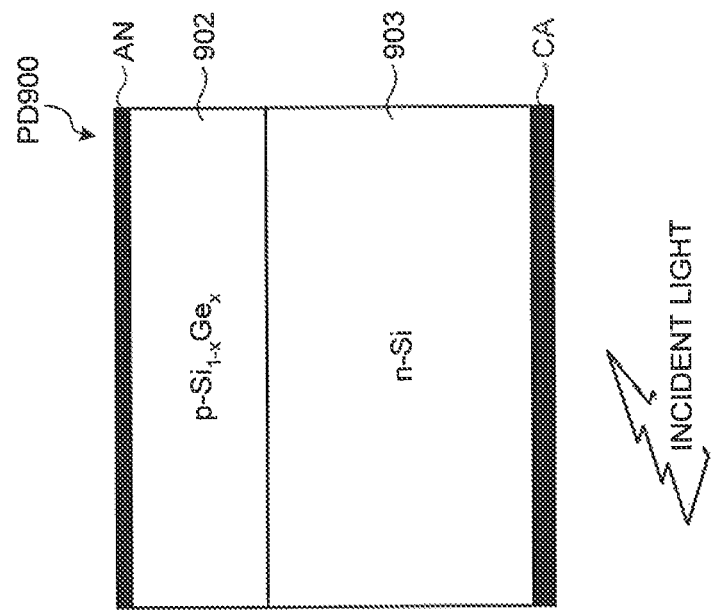
FIGS. 26A and 26B are diagrams illustrating the comparative examples.
Figure 26B:
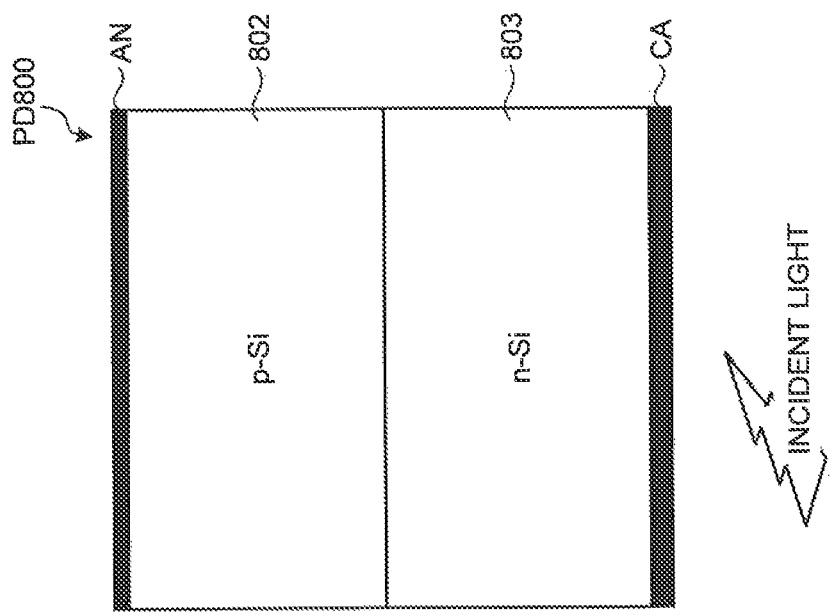

However, the photodiode PD900 illustrated in FIG. 26E is an example for optimizing a trade-off between "reducing the thickness of the photodiode to solve the problem of color mixture" and "deterioration of photoelectric conversion efficiency (or visible light absorption efficiency) due to a reduction in the thickness of the photodiode". In the photodiode PD900 illustrated in FIG. 26B, an "increase in dark current" which occurs when $Si_{1-x}Ge_x$ (0<x≤1) with a light absorption coefficient greater than that of Si is used is not considered. In the following description, in order to consider the characteristic model of the photodiode, a structure is employed in which an anode electrode AN is connected to an anode side semiconductor layer of the photodiode, and a cathode electrode CA is connected to a cathode side semiconductor layer (for example, the structure illustrated in FIGS. 26A and 26B). In this case, the anode electrode AN and the cathode electrode CA are not necessarily needed in terms of mounting.

Next, the dark current will be described. The dark current, is a reverse bias current of the photodiode which is represented by the sum of a diffusion (drift) term (i.e., a first term on the right side) of a minority carrier flowing into a PN junction of the photodiode and a generated current term (i.e., a second term on the right side) caused by the trap in the PN junction, as represented by the following Expression (1):

$$J_{rev} = J_{diff} + J_{GR} \quad (1)$$
$$= q\sqrt{(D/\tau)} \times n_i^2 / N_{dope} + qn_i W / \tau_g$$
$$= \text{(minority carrier diffusion term)} +$$
$$\text{(generated current term caused by trap)}$$

In Expression (1), eq indicates an elementary charge, D indicates a diffusion coefficient of the minority carrier, $\tau$ indicates the diffusion lifetime of the minority carrier, $n_i$ indicates an intrinsic carrier concentration, $N_{dope}$ indicates the dopant concentration in a region, which is a minority carrier supply scarce, W indicates the width of a depletion layer of a PN junction, and $\tau_g$ indicates the generation time of a current generated through a trap (or the lifetime of the carrier trapped in the trap). In Expression (1), it is assumed that "the entire photodiode is made of the same material" and "the accepter concentration $N_A$ of the anode electrode AN side>>the donor concentration $N_D$ of the cathode electrode CA side is established".

When a diffusion relaxation time and a momentum relaxation time are regarded to be the same, the relation given by the following Expression (2) exists among a diffusion coefficient D, a diffusion length L, a diffusion lifetime $\tau$, and the effective mass m* of the minority carrier.

$$D = \mu k_B T/q = q\tau/m^* \times k_B T/q \text{ and } L = \sqrt{(D\tau)} \quad (2)$$

Therefore, the term related to the diffusion of the minority carrier, which is the first term of Expression (1), is arranged as follows:

$$J_{diff} = q \times D_p / L_p \times n_i^2 / N_D + q \times D_n / L_n \times n_i^2 / N_A \quad (3)$$
$$= q(\sqrt{(k_B T/m_p^*)} \times n_i^2 / N_D + \sqrt{(k_B T/m_n^*)} \times n_i^2 / N_A)$$

where $k_B$ indicates a Boltzmann constant, T indicates an operation temperature, and suffixes n and p indicate an electron and a hole, respectively.

In addition, the intrinsic carrier concentration $n_i$ has a relation with the bandgap Eg which is represented by the following Expression (4):

$$n_i \propto \exp(-E_g/(2k_B T)) \quad (4)$$

That is, when a material (for example, $Si_{1-x}Ge_x$, 0<x≤1) with a bandgap Eg smaller than that of Si is introduced as a material forming, for example, the p-type semiconductor layer 902 of the photodiode PD900 illustrated in FIG. 26B, that is, a material with a light absorption efficiency higher than that of Si, the effective mass of the carrier is reduced and an intrinsic carrier concentration $n_i$ increases in the p-type semiconductor layer 902. Therefore, the value of a dark current component $J_{diff}$ is increased due to the diffusion of the minority carrier represented by Expression (3), and the dark current tends to increase, as compared to the photodiode PD800 (see FIG. 26A) which is entirely made of Si.

Figure 27:
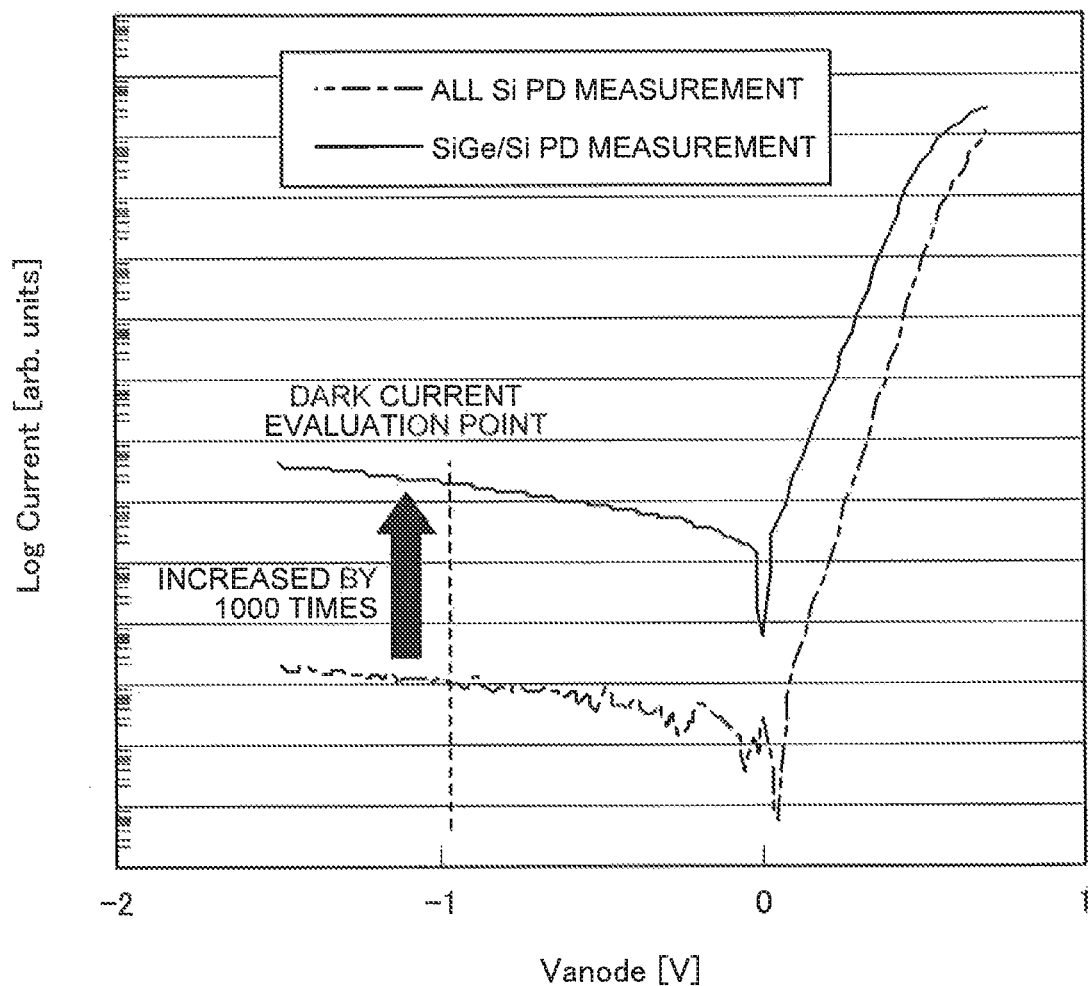
FIG. 27 is a diagram illustrating a dark current.

In order to confirm the above, the present inventors experimentally manufactured the photodiode PD900 illustrated in FIG. 26B in which the p-type semiconductor layer 902 was made of $Si_{1-x}Ge_x$ including about 20% to 30% (that is, x=0.2 to 0.3) of Ge and the photodiode PD800 illustrated in FIG. 26A as a comparative object in a situation in which dopant concentration $N_{dope}$ was substantially the same (in a situation in which accepter concentration $N_A$ was substantially common) and evaluated the I-V characteristics of the photodiodes at room temperature. As a result, illustrated in FIG. 27, in the photodiode PD900 ("SiGe/Si PD measurement") in which the p-type semiconductor layer 902 was made of a material with a bandgap Eg smaller than that of Si, the amount of dark current was increased by about three digits (about 1000 times) more than that in the photodiode PD800 (("all Si PD measurement") which was entirely made of Si.

This is considered. When the assumption that "the accepter concentration $N_A$ of the anode electrode AN side>>the donor concentration $N_D$ of the cathode electrode CA side is established" is applied to change the term corresponding to the minority carrier in the semiconductor layer of the anode electrode AN side in Expression (3), the following Expression (5) is obtained:

$$\sqrt{(k_B T/m_p^*)} \times n_i^2 / N_A \propto \sqrt{(\mu_n)} n_i^2 / N_A \approx \sqrt{(\mu_n)/N_A} \times \exp(-E_g/(K_B T)) \quad (5)$$

In expression (5), 1450 cm²/Vsec is substituted into the bulk intrinsic electron mobility $\mu_{nSi}$ of Si, and $\mu_{nSiGe}$=1450*0.7+3900*0.3=2185 cm²/Vsec which is obtained by setting the bulk intrinsic electron mobility of Ge to 3900 cm²/Vsec and assuming a mobility linear function for a Ge fraction is substituted into the intrinsic electron mobility of SiGe. Similarly assuming the linear function, for the bandgap $Eg_{Si}$=1.12 eV of Si, the bandgap $Kg_{SiGe}$=1.12*0.7+0.69*0.3=0.99 eV of SiGe is substituted into Expression (5). From rough estimation that the mobility ratio of Si and SiGe does not depend on the dopant concentration $N_{dope}$, the ratio of the product related, to the minority carrier diffusion in Expression (3) is restored, to the ratio in Expression (5) and the following Expression (6) is obtained:

$$\sqrt{(\mu_{nSiGe})} \times \exp(-Eg_{SiGe}/(k_B T))/\sqrt{(\mu_{nSi})} \times \exp(-Eg_{Si}/(k_B T)) = 180 = (2 \text{ digits}) \quad (6)$$

Therefore, it is expected that the dark current ratio will be increased by about two digits from the expressions. As can be seen from FIG. 27, when SiGe is introduced, the dark current was increased by about three digits (about 1000 times). That is, it was experimentally and logically confirmed that the introduction of SiGe led to an increase in the dark current.

It can be assumed that the reason why the quantitative and theoretical values of the rate of increase are different from each other in Expression (5) and Expression (6) is that a trap site exists at a hetero interface due to, for example, a lattice mismatch with an Si substrate, and the trap-caused generated current term in Expression (1) increases.

In the above-mentioned example, $Si_{1-x}G_x$ (0<x≤1) with a bandgap Eg smaller than that of Si is used as the material with a light absorption efficiency higher than that of Si. However, as illustrated in FIGS. 25A to 25C, for example, a material with light absorption efficiency higher than that of Si and a bandgap Eg larger than that of Si, such as $In_xGa_{1-x}As$ or InP, may be used. Even in this case, the important thing is not the magnitude of the bandgap Eg, but is the magnitude relation among the dopant concentration $N_{dope}$ of the minority carrier, the diffusion coefficient D thereof, the diffusion length L thereof, and the intrinsic carrier concentration $n_i$ related to current transmission defined by the Expression (3), which is represented by the following Expression (7);

$$D/L \times n_i^2/N_{dope} \tag{7}$$

It is noted that, when the relational expression represented, by Expression (7) is greater than that when the entire photodiode is made of Si, the amount of dark current is more than that when the entire photodiode is made of Si.

The increase in the dark current is interpreted as indicating that an optical signal is input ("ON" state) even in a dark environment in which there is no optical signal, and thus the signal is amplified. That is, the increase in the dark current leads to an increase in so-called "dark noise". In other words, $Si_{1-x}Ge_x$ (0<x≤1) illustrated in FIG. 26B can be introduced to solve the tradeoff between "color mixture" and "photoelectric conversion efficiency", but the structure illustrated in FIG. 26B does not necessarily solve the tradeoff among the "color mixture", the "photoelectric conversion efficiency", and the "dark current".

Therefore, as illustrated in FIG. 1, this embodiment is based on a structure (for example, see FIG. 26B) in which a PN junction is formed between a semiconductor layer 3 and a semiconductor layer 2 with a light absorption coefficient greater than that of the semiconductor layer 3, and a semiconductor layer 1 with a relational expression represented by Expression (7) that is less than that of the semiconductor layer 2 is further added to reduce the dark current.

Specifically, the solid-state imaging device SIS according to this embodiment includes a plurality of pixels P. Each pixel P includes a photoelectric conversion element PD. The photoelectric conversion element PD has, for example, a PN junction interface, converts incident light into an electric signal in the vicinity of the PN junction interface, generates and accumulates electrical charge corresponding to the intensity of light.

As illustrated in FIG. 1, the photoelectric conversion element PD of each pixel P includes the first semiconductor layer 1, the second semiconductor layer 2, and the third semiconductor layer 3. A semiconductor substrate is not illustrated in FIG. 1. However, in the photoelectric conversion element PD, for example, a side close to the first semiconductor layer 1 is the front side of the semiconductor substrate, and a side close to the third semiconductor layer 3 is the rear side of the semiconductor substrate.

The first semiconductor layer 1 is arranged adjacent to the second, semiconductor layer 2. The first semiconductor layer 1 is provided on, for example, a main surface 2a of the second semiconductor layer 2. The first semiconductor layer 1 is made of a semiconductor (for example, Si) containing, for example, first-conductivity type (for example, positive) dopants. The positive dopant (hereinafter referred to as p-dopant) is, for example, boron. For example, the bandgap of the material (for example, Si) forming the first semiconductor layer 1 is the same as that of the material (for example, Si) forming the third semiconductor layer 3.

The second semiconductor layer 2 is arranged adjacent to the first semiconductor layer 1. The second semiconductor layer 2 includes, for example, the main surface 2a and a main surface 2b. The main surface 2b is opposite to the main surface 2a. The second semiconductor layer 2 is made of a semiconductor (for example, $Si_{1-x}Ge_x$, 0<x≤1) containing, for example, first-conductivity type (for example, positive) dopants. The p-dopant is, for example, boron. The absorption coefficient of the material (for example, $Si_{1-x}Ge_x$, 0<x≤1) forming the second semiconductor layer 2 for visible light is greater than the absorption coefficient of the material (for example, Si) forming the third semiconductor layer 3 for visible light (see FIGS. 25A to 25C). For example, the bandgap of the material (for example, $Si_{1-x}Ge_x$, 0<x≤1) forming the second semiconductor layer 2 is smaller than that of the material (for example, Si) forming the first semiconductor layer 1 and is smaller than that of the material (for example, Si) forming the third semiconductor layer 3.

When the absorption coefficient of the material forming the second semiconductor layer 2 for visible light is greater than that of the material forming the third semiconductor layer 3 for visible light, the bandgap of the material forming the second semiconductor layer 2 may be greater than that of the material (for example, Si) forming the third semiconductor layer 3 (for example, $In_xGa_{1-x}As$ or InP) (see FIGS. 25A to 25C).

The third semiconductor layer 3 is arranged adjacent to the second semiconductor layer 2. For example, the third semiconductor layer 3 is arranged adjacent to the second semiconductor layer 2 on the side opposite to the first semiconductor layer 1. For example, the third semiconductor layer 3 is provided on the main surface 2b of the second semiconductor layer 2. The third semiconductor layer 3 is made of a semiconductor (for example, Si) containing, for example, second-conductivity type (for example, negative) dopants. The negative dopant (hereinafter referred to as n-dopant) is, for example, phosphorus or arsenic. For example, the bandgap of the material (for example, Si) forming the third semiconductor layer 3 is equal to that of the material (for example, Si) forming the first semiconductor layer 1.

The second conductivity type is opposite to the first conductivity type. That is, in the photoelectric conversion element PD, the interface between the second semiconductor layer 2 and the third semiconductor layer 3 functions as the PN junction interface.

In the solid-state imaging device SIS, the following Expressions (8) and (9) are established:

$$D_{2m3}/L_{2m3} \times n_{i3}^2/N_2 < D_{1M2}/L_{1M2} \times n_{i2}^2/N_2 \tag{8}$$

and $$D_{1m1}L_{1m1} \times n_{i1}^2/N_1 < D_{1m2}/L_{1m2} \times n_{i2}^2/N_1 \tag{9}$$

In Expressions (8) and (9), the diffusion coefficient of the minority carrier in the first semiconductor layer 1 is $D_{1m1}$, the diffusion length of the minority carrier in the first semiconductor layer 1 is $L_{1m1}$, the intrinsic carrier concentration in the first semiconductor layer 1 is $n_{i1}$, and the dopant concentration in the first semiconductor layer 1 is $N_1$. In addition, the diffusion coefficient of the minority carrier in the second semiconductor layer 2 is $D_{1m2}$, the diffusion coefficient of the majority carrier in the second semiconductor layer 2 is $D_{1M2}$, the diffusion length of the minority carrier in the second semiconductor layer 2 is $L_{1m2}$, the diffusion length of the majority carrier in the second semiconductor layer 2 is $L_{1M2}$, and the intrinsic carrier concentration in the second semiconductor layer 2 is $n_{i2}$. Furthermore, the diffusion coefficient of the minority carrier in the third semiconductor layer 3 is $D_{2m3}$, the diffusion length of the minority carrier in the third semiconductor layer 3 is $L_{2m3}$, the intrinsic carrier concentration in the third semiconductor layer 3 is $n_{i3}$, and the dopant concentration in the third semiconductor layer 3 is $N_2$. As suffixes, a first-conductivity type minority carrier is represented by "1m", a first-conductivity type majority carrier is represented by "1M", and a second-conductivity type minority carrier is represented by "2m".

Alternatively, when the mobility of the minority carrier in the first semiconductor layer 1 is $\mu_{1m1}$, the mobility of the minority carrier in the second semiconductor layer 2 is $\mu_{1m2}$, the mobility of the majority carrier in the second semiconductor layer 2 is $\mu_{1M2}$, and the mobility of the minority carrier in the third semiconductor layer 3 is $\mu_{2m3}$, the functions described in Expressions (2) and (3) can be used to rewrite Expressions (8) and (9) to become Expressions (10) and (11). That is, in the solid-state imaging device SIS, the following Expressions (10) and (11) are established:

$$\sqrt{(\mu_{2m3})} \times n_{i3}^2/N_2 < \sqrt{(\mu_{1M2})} \times n_{i2}^2/N_2 \quad (10)$$

and $$\sqrt{(\mu_{1m1})} \times n_{i1}^2/N_1 < \sqrt{(\mu_{1m2})} \times n_{i2}^2/N_1 \quad (11)$$

In other words, in each photoelectric conversion element PD of the solid-state imaging device SIS, the material and structure of the second semiconductor layer 2 are configured so as to satisfy Expressions (8) and (9) or Expressions (10) and (11), from the relation with the material and structure of the first semiconductor layer 1 or the material and structure of the third semiconductor layer 3. In this way, for example, the first semiconductor layer 1 can function as a barrier (a barrier for preventing the diffuse inflow of the minority carriers) for preventing the flow of the dark current to the second semiconductor layer 2. In the following description, in some cases, the first semiconductor layer 1 is referred to as a barrier layer since it functions as a barrier (a barrier for preventing the diffuse inflow of the minority carriers) for the second semiconductor layer 2.

Specifically, the solid-state imaging device SIS is, for example, a back side illumination (BSI) CMOS image sensor (see the type (c) in FIG. 28) in which, for example, the third semiconductor layer 3 is the light incident side, the third semiconductor layer 3 on the light incident side is an n-type semiconductor layer, and each of the second semiconductor layer 2 and the first semiconductor layer 1 is a p-type semiconductor layer. That is, the first conductivity type is positive and the second conductivity type is negative. In this case, since, the first-conductivity type minority carrier "1m" is an electron, "1m" is replaced with "n" indicating an electron. Since the first-conductivity type majority carrier "1M" is a hole, "1M" is replaced with "p" indicating a hole. Since the second-conductivity type minority carrier "2m" is a hole, "2m" is replaced with "p" indicating a hole. Since the first-conductivity type dopant, concentration $N_1$ is accepter concentration, "$N_1$" is replaced with "$N_A$" indicating accepter concentration. Since the second-conductivity type dopant concentration $N_2$ is donor concentration, "$N_2$" is replaced with "$N_D$" indicating donor concentration. Then, Expressions (8) and (9) become the following Expressions (12) and (13).

That is, in the solid-state imaging device SIS, the following Expressions (12) and (13) are established:

$$D_{p3}/L_{p3} \times n_{i3}^2/N_D < D_{p2}/L_{p2} \times n_{i2}^2/N_D \quad (12)$$

and $$D_{n1}/L_{n1} \times n_{i1}^2/N_A < D_{n2}/L_{n2} \times n_{i2}^2/N_A \quad (13)$$

Alternatively, when the components are replaced as described above, Expressions (10) and (11) become the following Expressions (14) and (15). In the solid-state imaging device SIS, the following Expressions (14) and (15) are established:

$$\sqrt{(\mu_{p3})} \times n_{i3}^2/N_D < \sqrt{(\mu_{p2})} \times n_{i2}^2/N_D \quad (14)$$

and $$\sqrt{(\mu_{n1})} \times n_{i1}^2/N_A < \sqrt{(\mu_{n2})} \times n_{i2}^2/N_A \quad (15)$$

In other words, in each photoelectric conversion element PD of the solid-state imaging device SIS, the material and structure of the second semiconductor layer 2 are configured so as to satisfy Expressions (12) and (13) or Expressions (14) and (15), from the relation with the material and structure of the first semiconductor layer 1 or the material and structure of the third semiconductor layer 3.

In the following description, in order to consider the characteristic model of the photoelectric conversion element PD (for example, a photodiode), a structure is employed in which the anode electrode AN is further connected to the anode side semiconductor layer, and the cathode electrode CA is further connected to the cathode side semiconductor layer in the photoelectric conversion element PD (for example, the structure illustrated in FIG. 1). However, the anode electrode AN and the cathode electrode CA are not necessarily needed in terms of mounting.

The present inventors conducted computer simulations in order to verify the effect of the structure of the photoelectric conversion element PD according to the embodiment. The simulation results will be described below.

First, a simulation when there was no carrier trap due to, for example, dangling bonds (i.e., when attention is paid only to the minority carrier diffusion term of Expression (1)) was conducted.

Specifically, as the structure of the photoelectric conversion element PD (for example, a photodiode), five types of structures A to E illustrated in FIG. 2 were prepared for simulations, the I-V characteristics of each photoelectric conversion element PD (for example, a photodiode) at T=333 K were calculated, and the dark current was evaluated.

Among the five types of structures A to E, the structures C to E correspond to this embodiment and the structures A and B correspond to comparative examples.

The structure A illustrated in FIG. 2 corresponds to the photodiode PD900 illustrated in FIG. 26B. In the structure A, the anode electrode AN is directly attached to an SiGe layer 902*a*. However, the Ge composition ratio of a portion of the SiGe layer 902*a* in the vicinity of the front, surface was 30%, the Ge composition ratio of a portion of the SiGe layer 902*a* in the vicinity of the interface between the SiGe layer 902*a* and an Si layer 903*a* was 20%, and the composition of the SiGe layer 902*a* was linearly changed therebetween. The thickness of the SiGe layer 902*a* was 400 nm and the thickness of the Si layer 903*a* was 1.5 μm.

The structure B illustrated in FIG. 2 corresponds to the photodiode PD800 illustrated in FIG. 26A and is entirely made of Si (since this simulation is focused only on the dark current, an Si thickness of 3 μm or more is not ensured, but the thickness of Si is 2 μm). In the structure B, an Si layer with a thickness of 2 μm includes a p-Si layer 802b arranged on the anode electrode AN side and an n-Si layer 803b arranged on the cathode electrode CA side.

In the structure C illustrated in FIG. 2, a barrier layer 1c is added between the anode electrode AN and the SiGe layer 902a (SiGe layer 2c), as compared to the structure A. It is assumed that the barrier layer 1c is made of single-crystal Si (c-Si) with the same mobility as that of bulk Si. The thickness of the barrier layer 1c was 100 nm to 300 nm, the thickness of the SiGe layer 902a was 400 nm, and the thickness of the Si layer 903a was 1.5 μm. In the following description, in some cases, the structure C is referred to as a structure according to Example 2.

In the structure D illustrated in FIG. 2, a barrier layer 1d is added between the anode electrode AN and the SiGe layer 902a (SiGe layer 2d), as compared to the structure A. It is assumed that the barrier layer 1d is made of amorphous Si (a-Si) with a mobility that is $1/100$ of the mobility of bulk Si. The thickness of the barrier layer 1d was 100 nm to 300 nm, the thickness of the SiGe layer 902a was 400 nm, and the thickness of an Si layer 3d was 1.5 μm. In the following description, in some cases, the structure D is referred to as a structure according to Example 1.

In the structure E illustrated in FIG. 2, a barrier layer 1e is added between the anode electrode AN and the SiGe layer 902a (SiGe layer 2e), as compared to the structure A. In order to clarify the importance of the magnitude relation of the relational expression represented by the Expression (7), not the magnitude of the bandgap Eg, it is assumed that the barrier layer 1e is made of amorphous Si (a-Si) with a mobility that is virtually the same as that of bulk Si.

As describe above, the first semiconductor layer i (e.g., the barrier layers 1c to 1d) and the third semiconductor layer 3 (e.g. layers 3c to 3e in FIG. 2) can be made of Si or a-Si. The second semiconductor layer 2 (e.g. the layers 2c to 2e in FIG. 2) can be made of SiGe. The a-Si layer for the first or third semiconductor layer 1 or 2 can be formed by implanting ions into a monocrystal Si layer.

As illustrated in Expression (1), the dopant concentration $N_{dope}$ is also a dark current control parameter. Therefore, for the structures A to E, as illustrated in FIGS. 3A to 3C, the thickness of the barrier layer or the distribution of dopants, such as donors or accepters, was also simulated.

Figure 4:
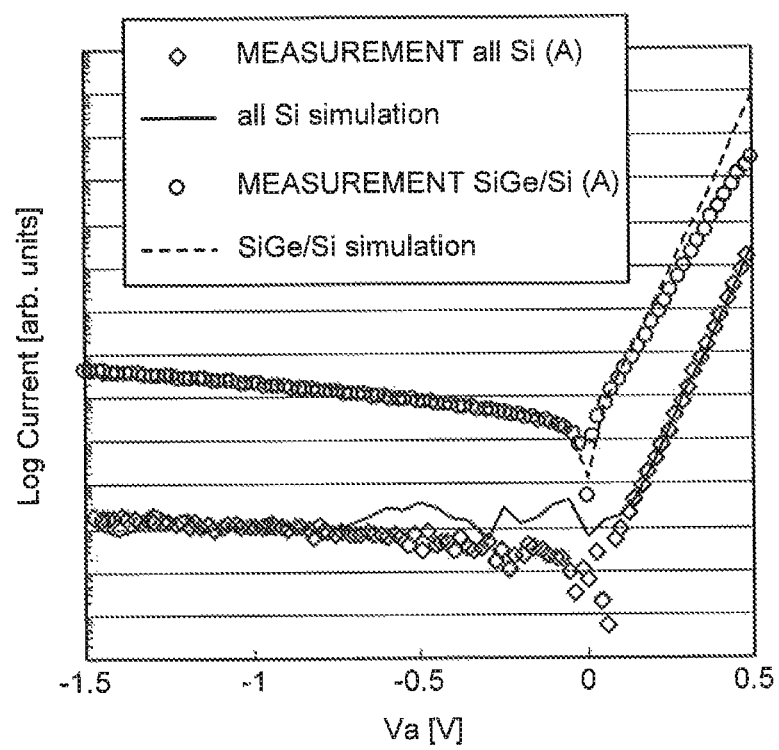
FIG. 4 is a diagram illustrating the operation of the photoelectric conversion elements according to the embodiment and the comparative examples.

In addition, it is emphasized that the simulator used for examination is a so-called calibrated simulator which is quantitatively equal to actual measurement with accuracy, as illustrated in FIG. 4.

Figures 3A, 3B, 3C:
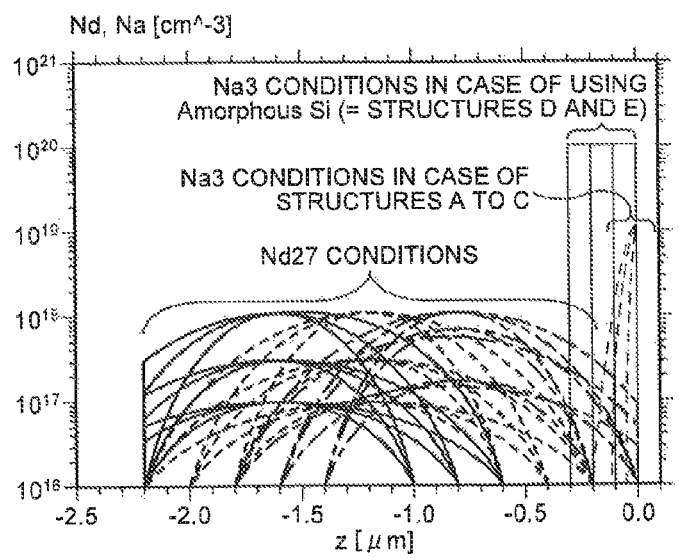
FIGS. 3A to 3C are diagrams illustrating the structure of the photoelectric conversion elements according to the embodiment and the comparative examples.
Figure 5:
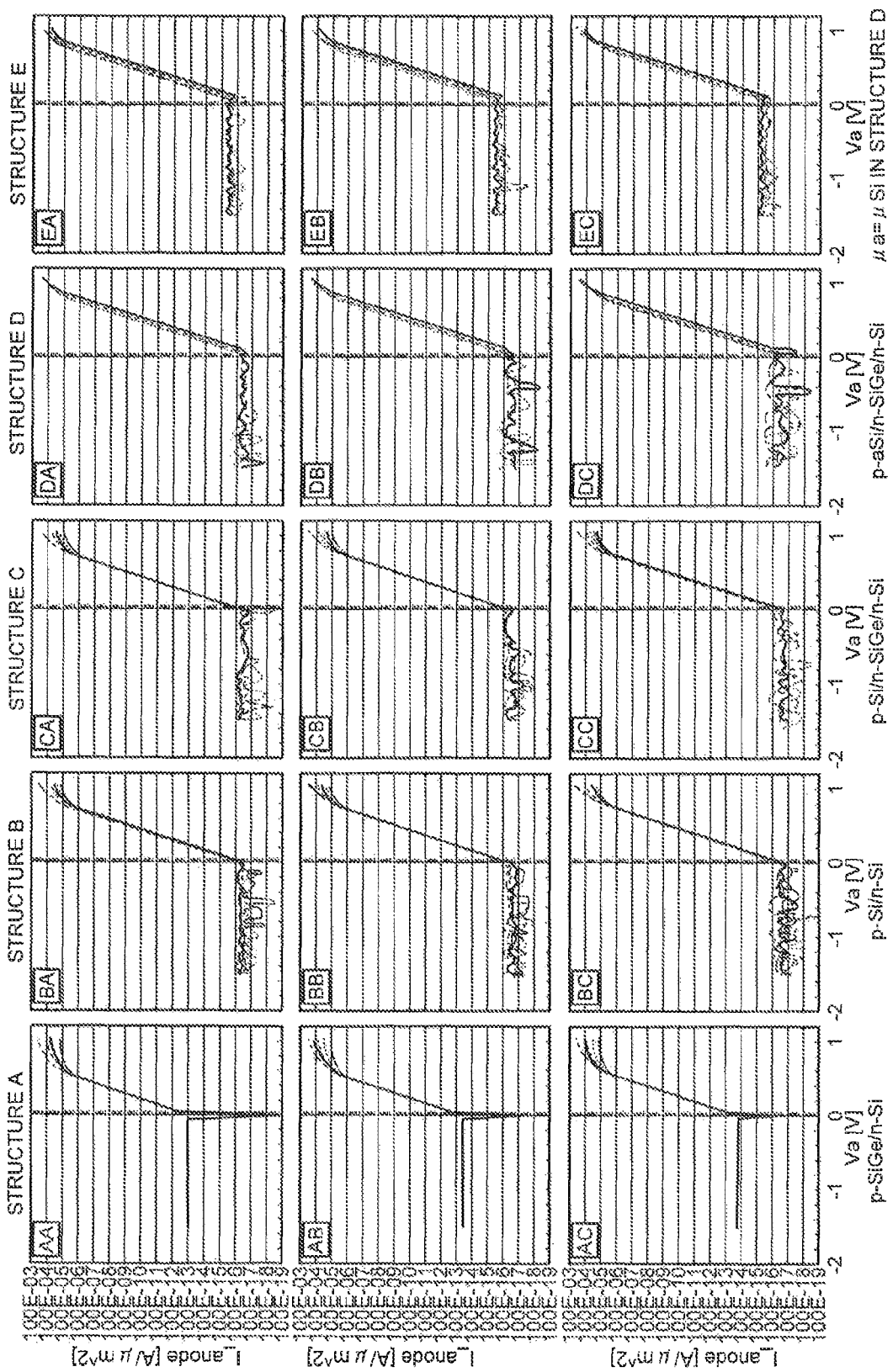
FIG. 5 is a diagram illustrating the operation of the photoelectric conversion elements according to the embodiment and the comparative examples.

FIG. 5 illustrates the simulation results of the I-V characteristics when simulations are performed in combinations of the conditions of the structures A to E illustrated in FIG. 2 and the dopant distributions illustrated in FIGS. 3A to 3C. Here, in FIG. 5, different kinds of lines (solid lines or dashed lines) correspond to lines indicating the conditions of the combinations of the structures illustrated in FIG. 2 and the dopant distributions illustrated in FIGS. 3A to 3C (this holds for lines illustrated in FIG. 7A, FIG. 7B, or FIG. 8, which will be described below). In the examination, a simulation for the dark current caused by the trap-caused generated current is not considered. Examination considering a trap will be described below.

Figure 6:
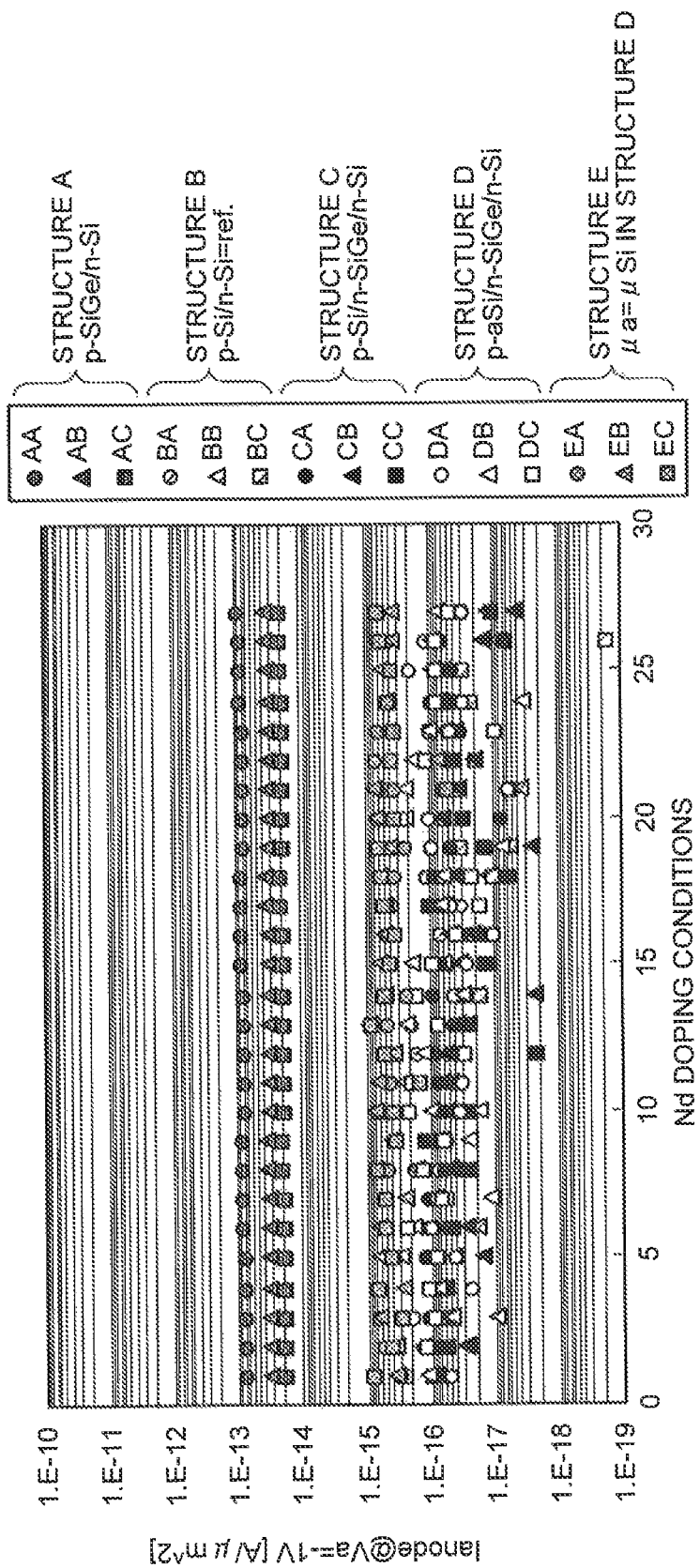
FIG. 6 is a diagram illustrating the operation of the photoelectric conversion elements according to the embodiment and the comparative examples.

From FIG. 5, a dark current, which is a reverse current of the photoelectric conversion element PD, is defined as an anode current when the voltage Va of the anode electrode AN is −1.0 V, which is illustrated in FIG. 6. In FIG. 6, the horizontal axis corresponds to donor distribution conditions illustrated in FIGS. 3A to 3C. As can be seen from FIG. 6, the dark current of the structure A (structures AA to AC) is about two or three digits more than that of other structures B to E, regardless of barrier thickness (A, B, and C) or donor dopant distribution conditions (1-27). The structure C (structures CA to CC=Example 2) and the structure D (structures DA to DC=Example 1) can reduce the dark current so to be the same as that of the structure B (structures BA to BC) in which the entire photodiode is made of Si.

Figure 7A:
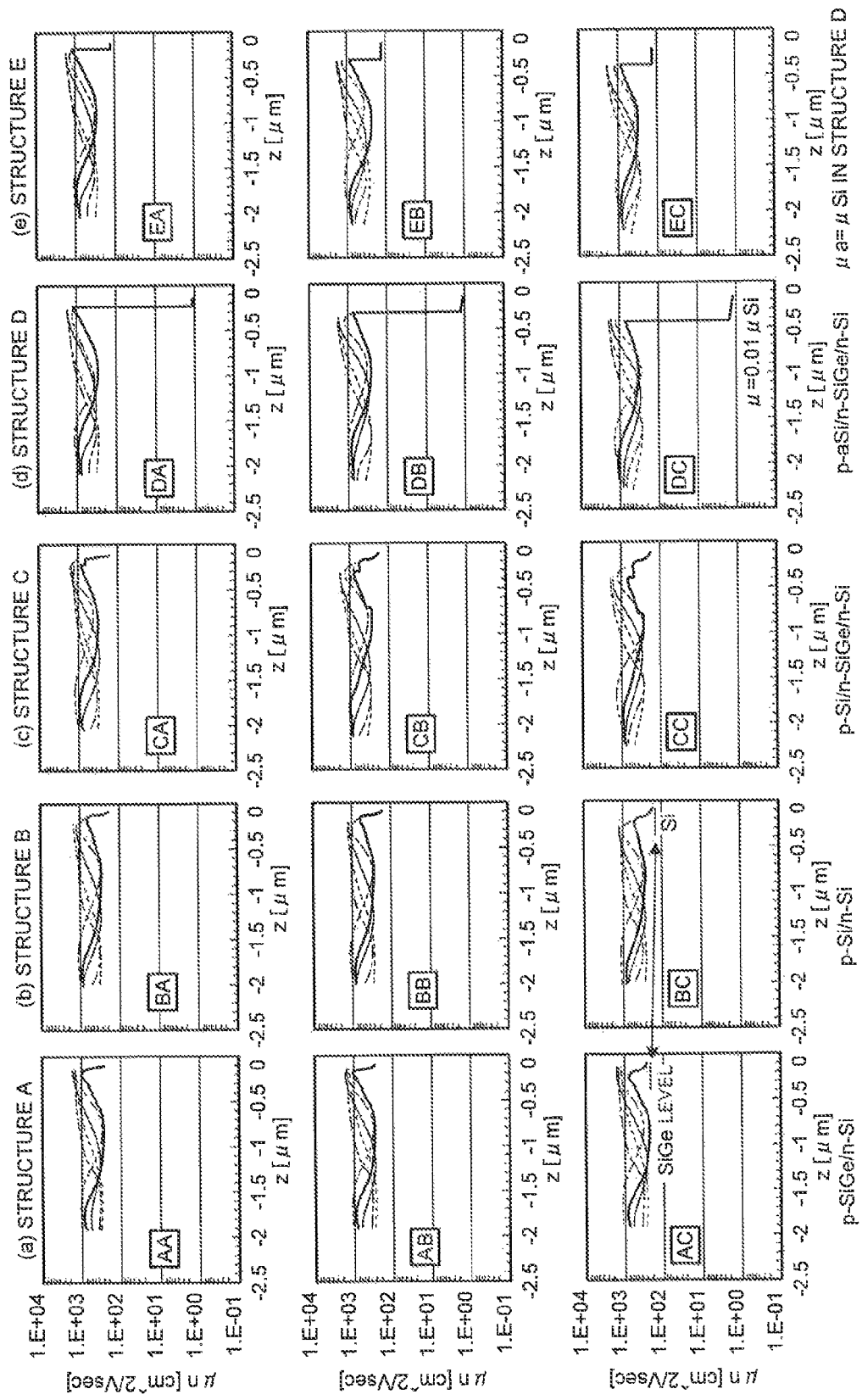
FIG. 7A is a diagram illustrating the operation of the photoelectric conversion elements according to the embodiment and the comparative examples.
Figure 7B:
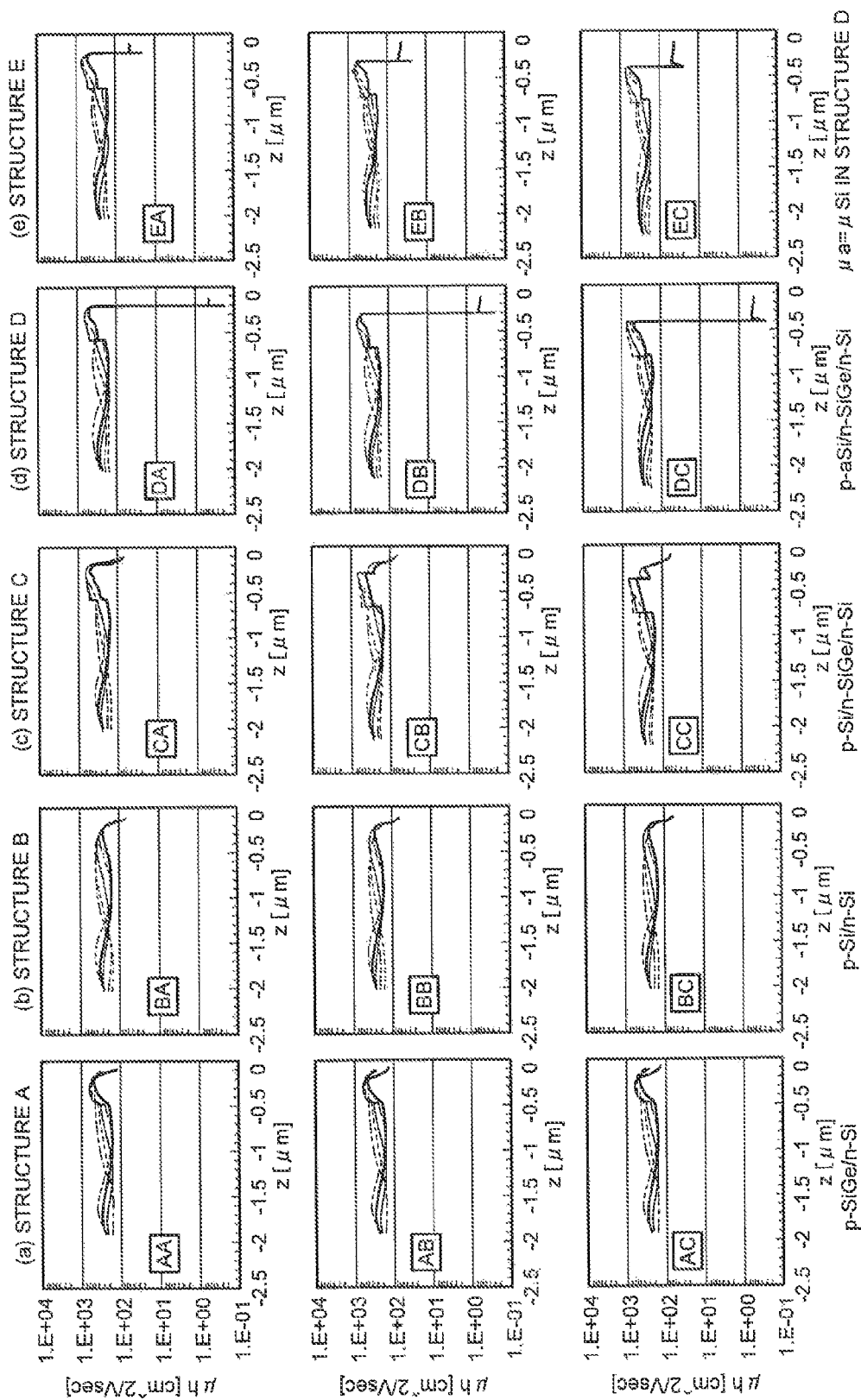
FIG. 7B is a diagram illustrating the operation of the photoelectric conversion elements according to the embodiment and the comparative examples.

The comparison, between the structure D and the structure E is notable. As illustrated in FIG. 2 and FIG. 7A, the two structures D and E are similar to each other in the bandgap Eg of the barrier layer and the dopant distribution conditions, but are different from each other in the mobility of electrons, which are the minority carriers in the barrier layer. As can be seen from FIG. 6, the dark current value of the structure E is about one digit more than that of the structure D. When only the magnitude of the bandgap Eg between the bandgap Eg of the barrier layer and the bandgap Eg of a layer with a visible light absorption coefficient greater than that of Si is a problem, the analysis result of the dark current of the structure D will be the same as the analysis result of the dark current of the structure E. That is, the obtained analysis results of the dark current of the structure D and the dark current of the structure E clearly indicate that the magnitude relation of the relational expression (that is, the product of the minority carrier terms D/L and $n_i^2/N_{dope}$) represented by Expression (7), not the magnitude of the bandgap Eg, determines the dark current by the diffusion of the minority carriers.

Figure 8:
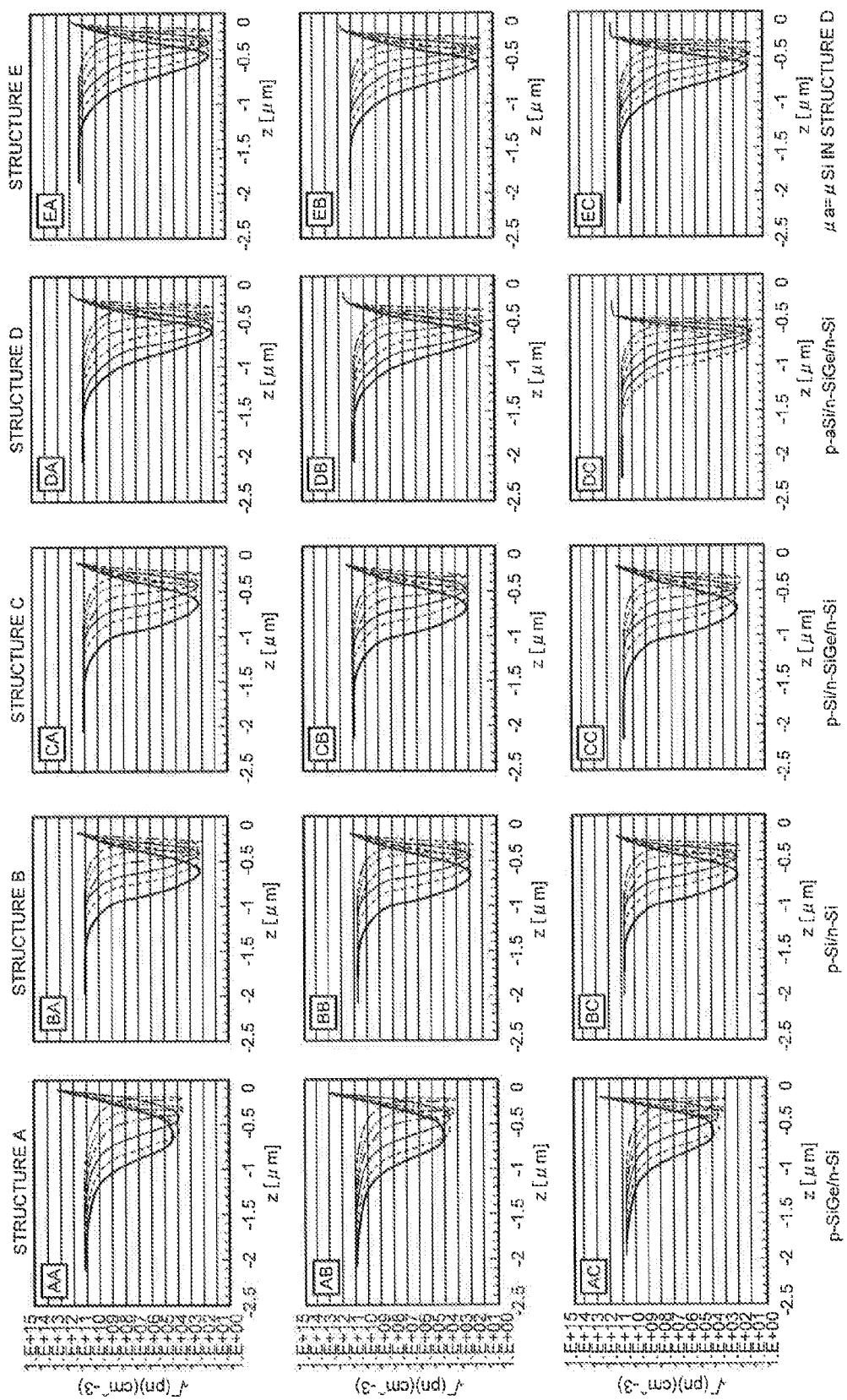
FIG. 8 is a diagram illustrating the operation of the photoelectric conversion elements according to the embodiment and the comparative examples.

It will be confirmed whether Examples 1 and 2 satisfy Expressions (12) and (13) and Expressions (14) and (15) obtained by changing Expressions (12) and (13). First, FIG. 7A illustrates the distribution of electron mobility μn, FIG. B illustrates the distribution of hole mobility μp, and FIG. 8 illustrates the distribution of √(pn), FIGS. 9A and 9B are tables of the comparison between the magnitudes of "the product of minority carrier terms D/L ($\propto \sqrt{\mu}$)) and $n_i^2/N_{dope}$" in the vicinity of the electrode which can be calculated from the dopant distribution conditions illustrated in FIGS. 3A to 3C. Here, it is noted that μ is not the intrinsic mobility value described in Expression (5), but is mobility, which is a dopant, concentration function in the simulation. In the semiconductor region in the vicinity of the electrode where thermal equilibrium is maintained, a pn product, that is, $pn=n_i^2$ is established. Therefore, the vertical axis value of a point z=0 (i.e., a contact between the anode electrode and PD) or the vertical axis value of a negative end point (i.e., a contact between the cathode electrode and PD) on the z axis in each structure illustrated in FIG. 8 corresponds to the intrinsic carrier concentration $n_i$, which is used to extract the value of the intrinsic carrier concentration $n_i$. In FIG. 9A, the value of the product (see Expression (7)) of the structure A in which the SiGe layer is directly attached to the anode electrode is surrounded by a bold frame and is emphasized. In comparison with the above, in both Examples 2 and 1, that, is, both the structures C and D, the value of the product (see Expression (7)) is small. Therefore, first, it was confirmed that Examples 1 and 2 satisfied Expression (13) and Expression (15) obtained by changing Expression (13). In the last row of FIG. 9B, the relation between the products in the structure in which the SiGe layer was directly attached to the cathode electrode was calculated and surrounded by a bold frame so as to be emphasized. In comparison with the value, in both Examples 2 and 1, that is, the structures C and D in FIG. 9B, the value of the product is small. Therefore, it was simultaneously confirmed that Examples 1 and 2 satisfied Expression (12) and Expression (14) obtained by changing Expression (12). From the above, it was confirmed that Examples 1 and 2 satisfied both Expressions (12) and (13) and Expressions (14) and (15) obtained by changing Expressions (12) and (13). As such, it may be concluded that the reason why the magnitude relation of the dark current illustrated in FIG. 6 is obtained is that "the magnitude relations represented by Expressions (12) to (15) are satisfied".

Next, simulations conducted for a case in which carriers were trapped by, for example, dangling bonds and the like (related to the trap term of Expression (1)).

The simulation result has been described above when there is no trap-caused term in the dark current, that is, when only the minority carrier diffusion dominates the dark current. However, it is rare that the dark current can be quantitatively described only by the minority carrier diffusion, as in a case of considering the difference in dark current between SiGe/Si and all Si in measurement using Expressions (5) and (6).

In the trap-caused current generation term of Expression (1), according to Shockley-Read-Hall (SRH model), $n_i/\tau_g$ (dimension $1/cm^3 sec$) can be represented by the following Expression (16):

$$n_i/\tau_g = GR_{SRH} \quad (16)$$
$$= (pn - n_{ie}^2) / \left\{ \begin{array}{l} \tau_{gn}(p + n_{ie}\exp(E_{trap}/k_gT)) + \\ \tau_{gp}(n + n_{ie}\exp(-E_{trap}/k_gT)) \end{array} \right\}$$

where p indicates the concentration of holes, n indicates the concentration of electrons, $\tau_g$ indicates the lifetime of carriers trapped in the trap, suffixes n and p indicate an electron and a hole, respectively, $E_{trap}$ indicates an energy level in the forbidden band of the trap, and $n_{ie}$ indicates intrinsic carrier concentration in an equilibrium state). It has been known that $\tau_g$ is inversely proportional to trap concentration $N_{trap}$ ($1/\tau_g \propto N_{trap}$).

Expression (16) means that, even when there is a trap, the GR term caused by the trap becomes zero in the equilibrium state (i.e., in a state in which the band is not bent). This is easily understood from that the mass action low (pn product is constant) represented by the following Expression (17) is established between the pn product and $n_{ie}$ in the equilibrium state and the numerator of Expression (16) is zero:

$$pn = n_{ie}^2 \quad (17)$$

On the contrary, this means that, when there are a large number of traps (the trap lifetime is short) at a position which largely deviates from the constant pn product (position where the band is bent), the amount of generated current caused by the trap increases. The position where the band is bent is the same as a position where a depletion layer is extended according to a function of a bias and a space charge during the PD operation.

When there is a trap, and a region (a region which is away from both ends of the width of the depletion layer to the center thereof) which is furthest away from, equilibrium overlaps the position of the trap, it is considered that the trap-caused dark current term increases. It is clear to pay attention to the relation between the trap and the dopant distribution in the determination of the effect of the invention. In the simulation, it is assumed that a trap site is distributed in the vicinity of an SiGe/Si hetero interface in which it is considered that a trap is likely to be generated by a difference in lattice constant while the structures illustrated in FIG. 2 and the dopant conditions illustrated in FIGS. 3A to 3C are fixed. In addition, it is assumed that the trap site generates a current, caused by the SRH model represented by Expression (16). Under the assumption, the simulations were conducted. Frankly speaking, the simulations were conducted considering plausible trap.

Figure 10A:
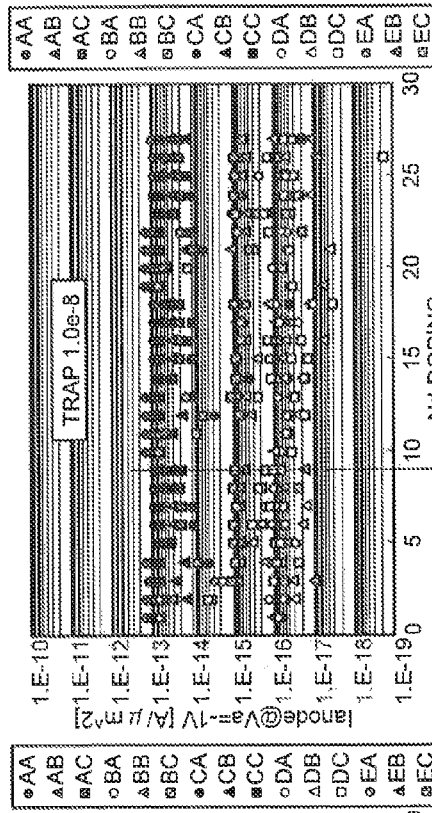
FIGS. 10A to 10D are diagrams illustrating the simulation results.
Figure 10B:
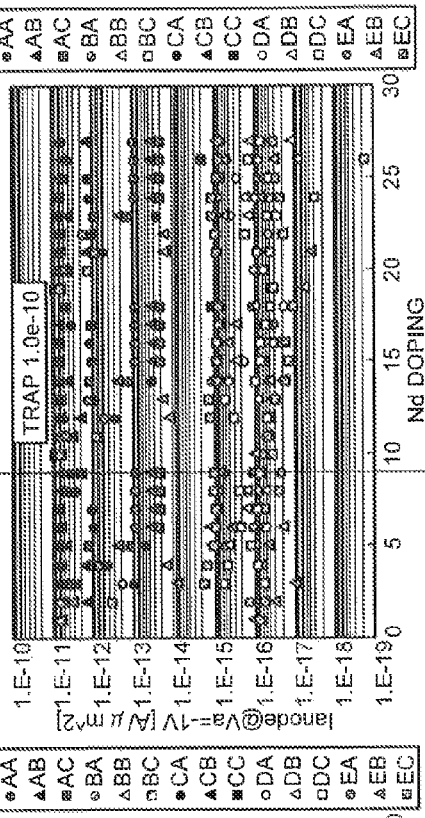
Figure 10C:
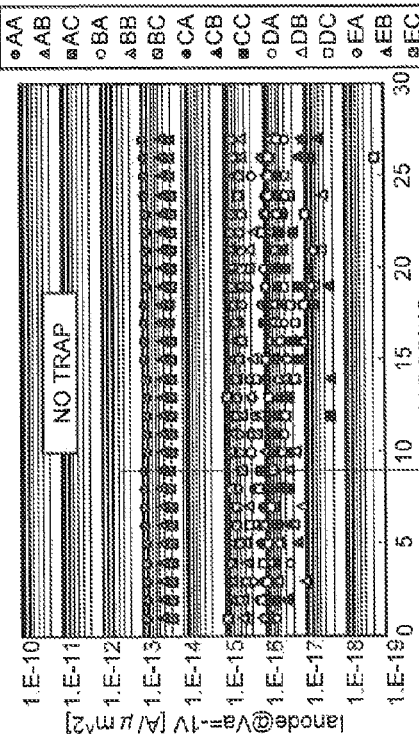
Figure 10D:
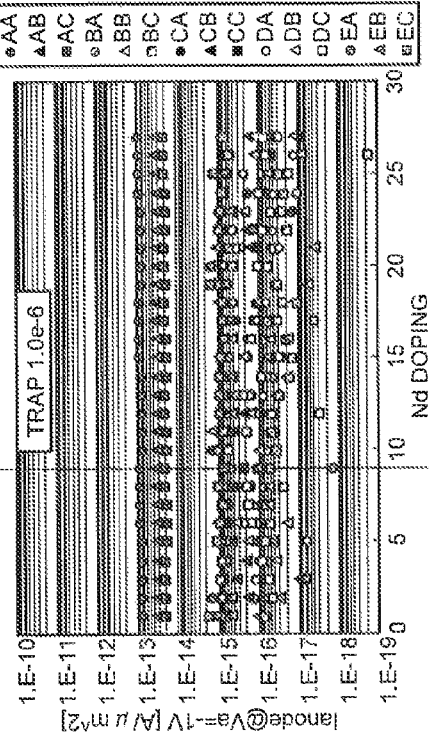

When there is no trap, the I-V characteristics are calculated as illustrated in FIG. 5, and a current at the voltage Va=−1 V of the anode electrode AN is used as the dark current. In this case, in FIGS. 10B to 10D, as in FIG. 6 in which there is no trap, the horizontal axis is a donor dopant condition and the vertical axis is the dark current. That is, it is assumed that $\tau_{gn}=\tau_{gp}=\tau_g$ is established with respect to the lifetime, which is a function of $N_{trap}$, and simulations are conducted under three kinds of conditions, that is, 1e−6 sec, 1e−8 sec, 1e−10 sec. The simulation results are illustrated in FIGS. 10B to 10D. In addition, for comparison, FIG. 10A illustrates a case in which there is no trap (that is, similarly to FIG. 6). Since the structure B just functions as a reference (reference Si), all of four graphs illustrated in FIG. 10 illustrate the calculation results when there is no trap. In addition, the measurement and the simulation of "SiGe/Si PD" illustrated in FIG. 4 are compared by substituting 1.0e−8 sec into $\tau_g$. From this, it is considered that the calculation result $\tau_g$=1.0e−8 sec among the three kinds of lifetimes examined in FIGS. 10A to 10D is most plausible.

FIGS. 11A to 11E are diagrams when viewing FIGS. 10A to 10D from another side, in which $\tau_{trap}$ on the horizontal axis is the above-mentioned $\tau_g$ and the vertical axis indicates a dark current value. As described above, since $\tau_g$ is inversely proportional to the trap concentration $N_{trap}$, trap concentration is reduced as the value on the horizontal axis illustrated in FIGS. 11A to 11E increases and a large value on the horizontal axis means a trap-free photoelectric conversion element PD. As can be seen from FIGS. 11A to 11E, in the structure C (i.e., Example 2) or the structure D (i.e., Example 1), in some cases, a dark current with the same level as that in the structure B (reference Si) is obtained, regardless of the examined trap concentration range (x-axis range), depending on a curved line, that is, depending on dopant distribution conditions. At the same time, when the trap concentration is high, it is recognized that the dark current reaches the dark current, level of Si as long as a process for reducing the trap can be implemented during the manufacture of the photoelectric conversion element PD, even when the dark current does not reach the dark current level of Si. On the other hand, in the structure A, it is recognized that there is a flat curve regardless of trap concentration. This means that, in the structure A, even when the photoelectric conversion element PD is manufactured with the highest quality to reduce the trap concentration, that is, even when the trap-caused term in Expression (1) indicating the dark current is approximately zero, the term caused by minority carrier diffusion in Expression (1) is not reduced and the dark current value is not reduce to the same as the dark current value of the structure 3 (reference Si).

In the structure C (i.e., Example 2) or the structure D (i.e., Example 1) in which the dark current is the same as that of the structure B (reference Si and all Si) when there is no trap, when the lifetime of the trap is reduced (when it is assumed that there are a large number of traps), in some cases, the dark current is certainly greater than that in the structure B. For example, as can be seen from FIG. 10D, in the structure D (i.e., Example 1), under donor dopant condition #9, even when the trap increases, the dark current value is equal to that in the structure B. On the other hand, as can be seen from FIGS. 10C, in the structure C (i.e., Example 2), under donor dopant condition #9, when the trap lifetime $\tau_g$ is 1.0e−6 (see FIG. 10B) or when the trap is not considered (see FIG. 10A), the dark current is equal to that in the structure B (reference Si and all Si) and is more than that in the structure A when the trap increases. That is, it is noted that, in the structure C (i.e., Example 2) or the structure D (i.e., Example 1), the effect is likely to vary depending on whether the trap is considered or not.

Figure 12:
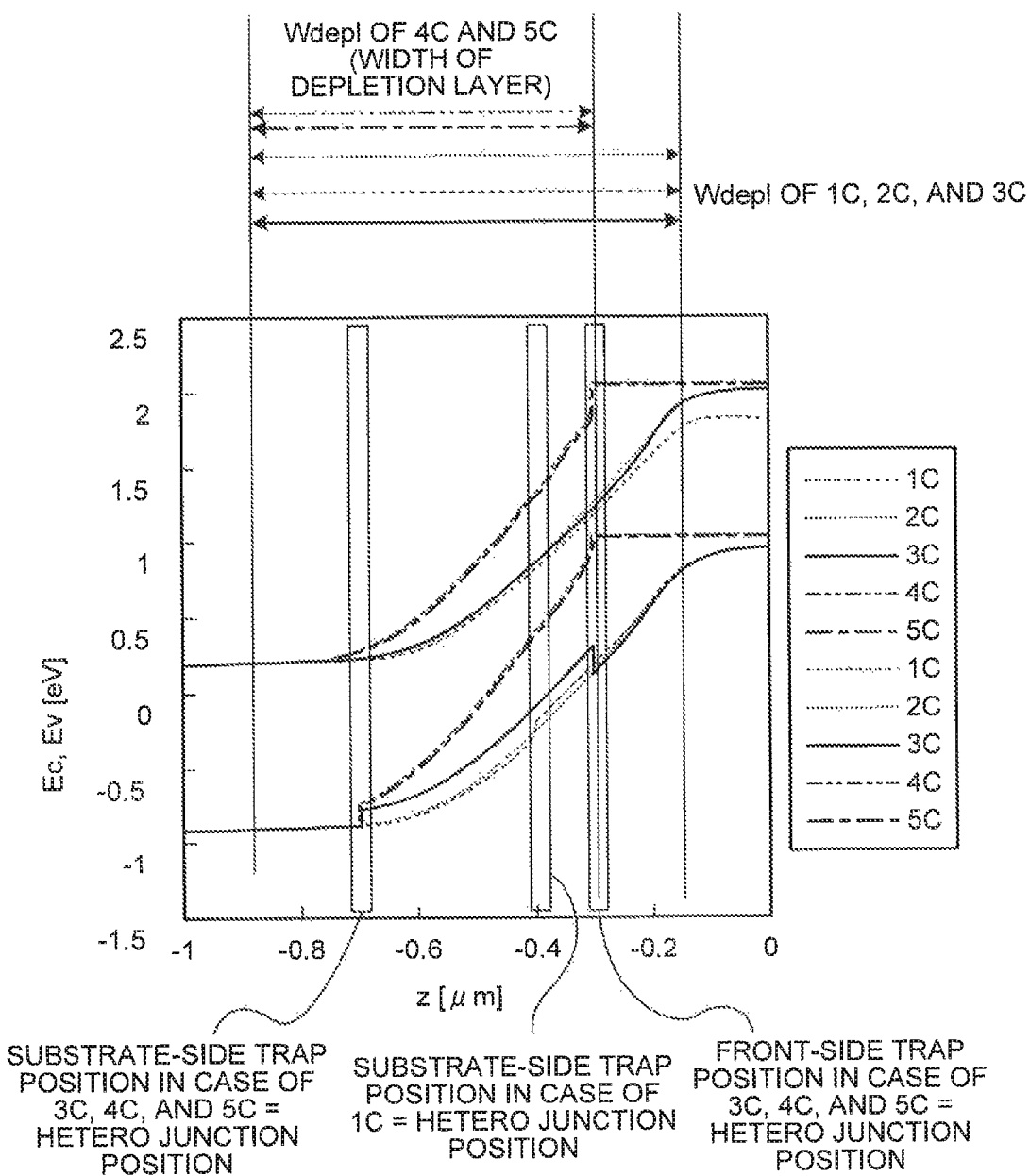
FIG. 12 is a diagram illustrating the dopant profile of the photoelectric conversion element according to the embodiment.

In order to clarify that the difference is caused by an increase in the dark current due to the trap based on Expression (16), for example, a band diagram in the depth direction at Va=−1 V under donor dopant condition #9 is illustrated in FIG. 12. FIG. 12 is a diagram illustrating the positional relation between the trap and the bending of the depletion layer. A portion surrounded by a white frame is a region in which a trap distribution is given on the simulation on the assumption that there are a large number of traps because of a hetero interface. As can be seen from FIG. 12, in the structure D (i.e., Example 1; which is represented by 4C in FIG. 12) in which the dark current is hardly changed, as compared to the structure B, even when the trap increases, the hetero interface of a-Si/SiGe or SiGe/Si where it is considered that the number of traps is large due to a lattice mismatch is exactly disposed at the end of the depletion layer in a depletion layer region represented by Wdepl. In other words, in the structure D (i.e., Example 1; which is represented by 4C in FIG. 12), in the photoelectric conversion element PD, the dopant profile of p-dopants gradually rises toward, the first semiconductor layer 1 and becomes flat in the first semiconductor layer 1. Therefore, since the bending of the band is small, the numerator of Expression (16) is approximately zero. Thus, it may be analyzed that the dark current caused by the trap is small.

In the structure C (i.e., Example 2, which is represented by 3C in FIG. 12), the hetero interface of a c-Si/SiGe side (front side) is located close to the center of the depletion layer region represented by Wdepl, not at both ends of Wdepl. In other words, the structure C (i.e., Example 2, which is represented by 3C in FIG. 12) is similar to the structure D in that, in the photoelectric conversion element PD, the dopant profile of the p-dopants rises toward the first semiconductor layer 1. However, in the structure C, the dopant profile does not become flat in the first semiconductor layer 1 and has an inclined portion in the first semiconductor layer 1 in the vicinity of an interface with the first semiconductor layer 2 such that dopant concentration increases as the distance increases from the interface with the first semiconductor layer 2. Therefore, the numerator of Expression (16) largely deviates from the equilibrium state in which the pn product is constant and it may be analyzed that the dark current caused by the trap increases.

As illustrated in FIG. 2 and FIG. 7A, the major difference between the structure D (i.e., Example 1) and the structure C (i.e., Example 2) is the distribution of accepter concentration $N_A$ in the vicinity of the anode electrode AN. As described, above, when there is a trap, it is necessary to design dopant distribution such that the trap is located at a position that is as close to the equilibrium state in which the band is not bent with respect to an external field as possible. In the structure D (i.e., Example 1) in which the barrier layer on the front side is made of a-Si (since a large amount of charge remains, concentration is high and the band is less likely to be bent), since the band of the hetero interface is close to equilibrium, the dark current is likely to be small. The structure D (i.e., Example 1) is more preferable than the structure C (i.e., Example 2) in that it can effectively reduce the dark current caused by the trap.

As described above, in the embodiment, in the photoelectric conversion element PD, the absorption coefficient of the material forming the second semiconductor layer 2 for visible light is greater than that of the material forming the third semiconductor layer 3 for visible light. In this way, it is possible to improve the photoelectric conversion efficiency of the photoelectric conversion element PD per unit film thickness. In addition, in the photoelectric conversion element PD, the material and structure of the second semiconductor layer 2 are configured so as to satisfy Expressions (8) and (9) or Expressions (10) and (11), from the relation with the material and structure of the first semiconductor layer 1 or the material and structure of the third semiconductor layer 3. In this way, for example, the first semiconductor layer 1 can function as a barrier (a barrier for preventing the diffuse inflow of the minority carrier) for preventing the dark current from flowing into the second semiconductor layer 2. That is, it is possible to improve the photoelectric conversion efficiency of the photoelectric conversion element PD per unit film thickness and reduce the dark, current in the photoelectric conversion element PD.

Therefore, it is possible to reduce the overall thickness of the photoelectric conversion element PD while maintaining the photoelectric conversion efficiency at the same level as that in the conventional art. As a result, it is possible to prevent the color mixture between adjacent pixels due to obliquely incident light and thus reduce color mixture noise. In addition, it is possible to reduce the dark current in the photoelectric conversion element PD and thus reduce dark current noise. As a result, it is possible to improve the S/N ratio of an image signal corresponding to charge generated by the photoelectric conversion element and thus improve the quality of the image obtained by the image signal.

In the embodiment, in the photoelectric conversion element PD, the third semiconductor layer 3 is on the light incident side, the first semiconductor layer 1 and the second semiconductor layer 2 are p-type semiconductor layers, and the third semiconductor layer 3 is an n-type semiconductor layer. That is, in the photoelectric conversion element. PD, the material and structure of the second semiconductor layer 2 are configured so as to satisfy Expressions (12) and (13) or Expressions (14) and (15), from the relation with the material and structure of the first semiconductor layer 1 or the material and structure of the third semiconductor layer 3. In this way, for example, the first semiconductor layer 1 can function as a barrier (a barrier for preventing the diffuse inflow of the minority carrier) for preventing the dark current from flowing into the second semiconductor layer 2.

Furthermore, in the embodiment, in the photoelectric conversion element PD, the bandgap of the material forming the second semiconductor layer 2 is smaller than that of the material forming the first semiconductor layer 1 and is also smaller than that of the material forming the third semiconductor layer 3. In this way, for example, when Si which is generally used as a material forming a semiconductor substrate is used as the material forming the third semiconductor layer 3, it is possible to use SiGe having a high affinity with the third semiconductor layer 3 as the material forming the second semiconductor layer 2.

Figure 29:
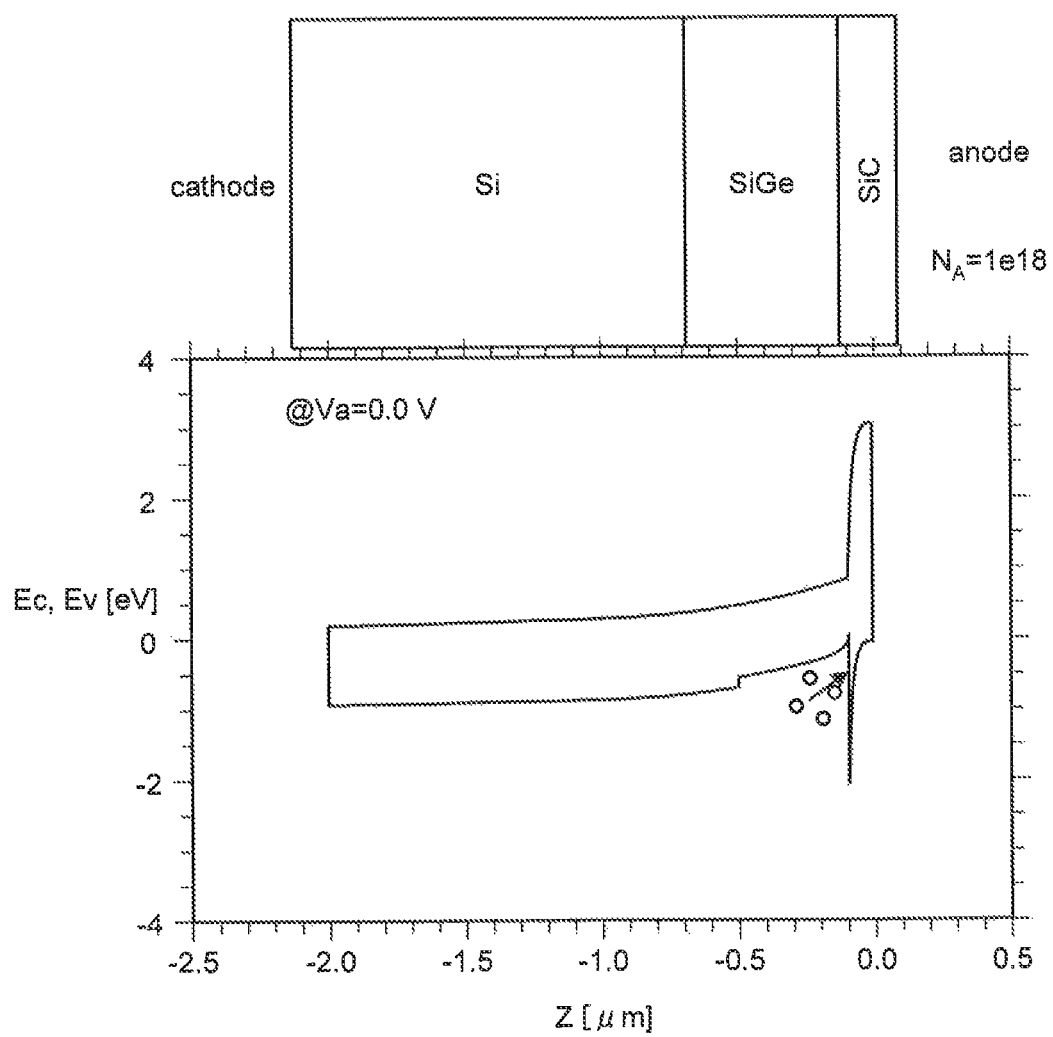
FIG. 29 is a diagram illustrating the band structure of the photoelectric conversion element according to the embodiment.

Here, a case will be considered in which a material which is an Si-based semiconductor material and has a bandgap Eg significantly greater than that of Si or SiGe is used as the material forming the first semiconductor layer 1. In general, intrinsic carrier concentration m can be reduced as the bandgap Eg increases and the effective mass of the carrier which is inversely proportional to the curvature of the band also increases. For example, when 4H—SiC is used as the material forming the barrier layer, the bandgap Eg is 3.2 eV, the intrinsic carrier concentration $n_i$ is 1.8e−6 $cm^{-3}$, and the effective mass me* of the carrier is 0.33 to 0.58 (which varies depending on the directions). Therefore, it is considered that the magnitude relation of the product (see Expression (7)) significantly increases. When only the dark current, is optimized, the barrier layer may be made of a material having a bandgap Eg that is significantly more than that of the SiGe layer. However, in this case, as illustrated in FIG. 29, a barrier (2.0 V or more) for a hole is generated in the vicinity of the interface between an SiC layer, which is a barrier layer, and the SiGe layer. In the realistic operation temperature range, it is not assumed that, the hole can pass through the barrier using a thermal mechanism. Therefore, the hole stays in the barrier. Then, the probability of recombination between holes and electrons increases in the portion where the hole stays and the carrier generated by photoelectric conversion is not extracted as a current, but is changed to heat or light. In order to prevent the change of the carrier to heat or light, for example, an additional design for significantly reducing the thickness of the barrier is needed such that, holes can pass through the barrier using a tunnel mechanism. For the above-mentioned reason, when the magnitude relation represented by Expression (7) is satisfied only by Eg, it is difficult to easily and effectively extract a photocurrent and photoelectric conversion efficiency is likely to be damaged.

In contrast, in the embodiment, in the photoelectric conversion element PD, the bandgap of the material forming the first semiconductor layer 1 is equal to that of the material forming the third semiconductor layer 3. In this way, the first semiconductor layer 1 can be made of c-Si or a-Si with a bandgap close to the bandgap Eg of SiGe and it is possible to reduce the dark current, easily extract, a photocurrent, and improve the photoelectric conversion efficiency.

In the embodiment, for example, in the photoelectric conversion element PD with the structure D (i.e., Example 1), the dopant profile of the first-conductivity type dopant rises toward the first semiconductor layer 1 and becomes flat in the first semiconductor layer 1 (see FIG. 12). In this way, it is possible to effectively reduce the dark current caused by the trap.

In the photoelectric conversion element PD illustrated in FIG. 1, when an elementary charge is q and a current path length from the anode electrode AN to the interface between the first semiconductor layer 1 and the second semiconductor layer 2 through the first semiconductor layer 1 is $L_1$, it is preferable that the current path length $L_1$ satisfy the following Expression (18):

$$L_1 > \sqrt{\{(k_B T/q)\mu_{1m1}\tau_{1m1}\}} \tag{18}$$

In Expression (18), $\mu_{1m1}$ indicates the mobility of the minority carrier, which is a bulk physical property in the first semiconductor layer 1, T indicates the operation temperature (for example, the maximum operation compensation temperature) of the solid-state imaging device SIS, and $\tau_{1m1}$ indicates the momentum relaxation time of the minority carrier, which is a bulk physical property in the first semiconductor layer 1. The reason is that, when the current path length $L_1$ is sufficiently longer than the minority carrier diffusion length, the dark current caused by the minority carrier current (in this case, an electron current) which is ballistically injected from the anode electrode is sufficiently negligible. In other words, when the thickness of the first semiconductor layer 1 is $TH_1$, it is preferable that the thickness $TH_1$ of the first semiconductor layer 1 satisfy the following Expression (19):

$$TH_1 > \sqrt{\{(k_B T/q)\mu_{1m1}\tau_{1m1}\}} \tag{19}$$

The order of the detailed length of $L_1$ is illustrated in a field L in FIG. 17.

Similarly, when a current path length from the interface between the second, semiconductor layer 2 and the third semiconductor layer 3 to the cathode electrode CA through the third, semiconductor layer 3 is $L_3$, it is preferable that the current, path length $L_3$ satisfy the following Expression (20):

$$L_3 > \sqrt{\{(k_B T/q)\mu_{3m3}\tau_{3m3}\}} \tag{20}$$

In Expression (20), $\mu_{3m3}$ indicates the mobility of the minority carrier, which is a bulk physical property in the third semiconductor layer 3, T indicates the operation temperature (for example, the maximum operation compensation temperature) of the solid-state imaging device SIS, and $\tau_{3m3}$ indicates the momentum relaxation time of the minority carrier, which is a bulk physical property in the third semiconductor layer 3. The reason is that, when the current path length $L_3$ is sufficiently longer than the minority carrier diffusion length, the dark current caused by the minority carrier current (in this case, a hole current) which is ballistically injected from, the cathode electrode is sufficiently negligible. In other words, when the thickness of the third semiconductor layer 3 is $TH_3$, it is preferable that the thickness $TH_3$ of the third semiconductor layer 3 satisfy the following Expression (21):

$$TH_3 > \sqrt{\{(k_B T/q)\mu_{3m3}\tau_{3m3}\}} \tag{21}$$

Figure 13:
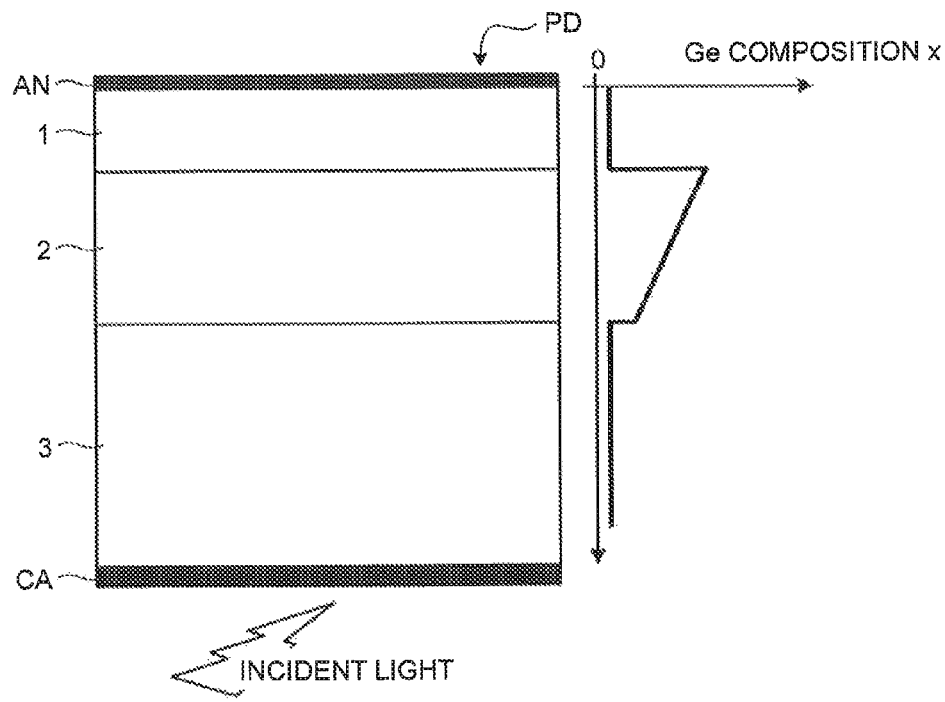
FIG. 13 is a diagram illustrating the structure of a photoelectric conversion element according to a modification of the embodiment.

Alternatively, in the photoelectric conversion element PD, for example, there may be a gradient in the composition ratio in the first semiconductor layer 1, the second semiconductor layer 2, and the third semiconductor layer 3. For example, as illustrated in FIG. 13, in the photoelectric conversion element PD, when the first semiconductor layer 1 is made of Si, the second semiconductor layer 2 is made of $Si_{1-x}Ge_x$ (0<x≤1), and the third semiconductor layer 3 is made of Si, the composition ratio of Ge in the second semiconductor layer 2 is reduced toward the interface between the second semiconductor layer 2 and the third semi conductor layer 3 and increases toward the interface between the first semiconductor layer 1 and the second semiconductor layer 2. In this case, the composition ratio of Ge in the second semiconductor layer 2 may be reduced in a stepwise manner toward the interface between the second semiconductor layer 2 and the third semiconductor layer 3 and may increase in a stepwise manner toward the interface between the first semiconductor layer 1 and the second semiconductor layer 2. Alternatively, for example, as illustrated in FIG. 13, the composition ratio of Ge in the second semiconductor layer 2 may be functionally (for example, linearly) reduced toward the interface between the second semiconductor layer 2 and the third semiconductor layer 3 and may functionally (for example, linearly) increase toward the interface between the first semiconductor layer 1 and the second semiconductor layer 2.

Figure 14:
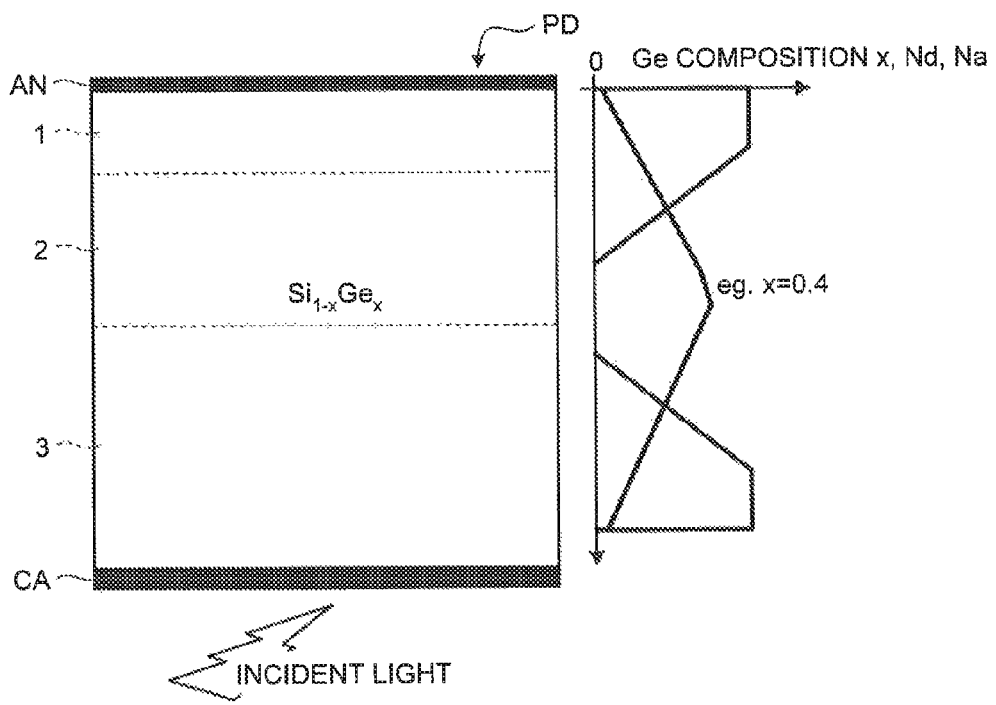
FIG. 14 is a diagram illustrating the structure of a photoelectric conversion element according to another modification of the embodiment.

Alternatively, for example, the photoelectric conversion element FD may be configured as illustrated in FIG. 14 in which a region in the vicinity of the center of a $Si_{1-x}Ge_x$ layer which has high Ge concentration and low Si concentration is used as the second semiconductor layer 2, and regions at both ends of the $Si_{1-x}Ge_x$ layer which has low Ge concentration and high Si concentration may be used as the first semiconductor layer 1 and the third semiconductor layer 3.

Figure 15:
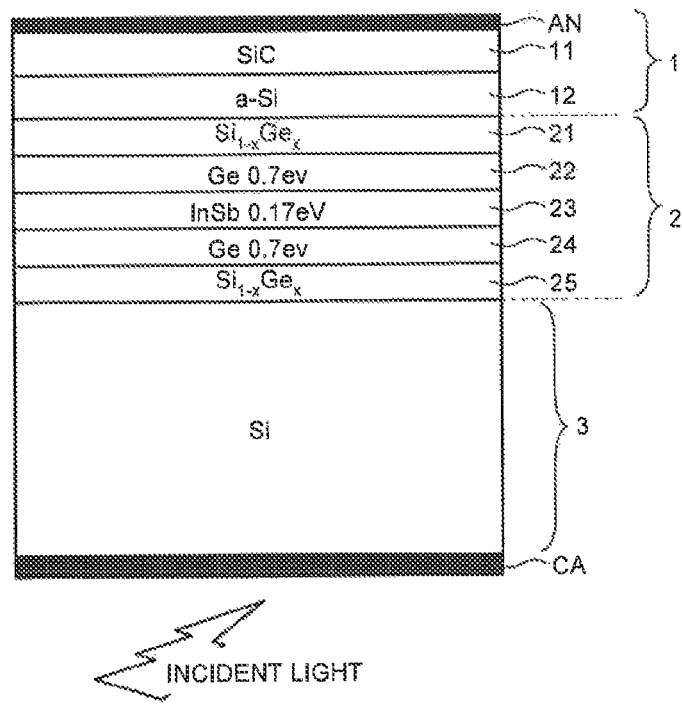
FIG. 15 is a diagram illustrating the structure of a photoelectric conversion element according to another modification of the embodiment.

Alternatively, in the photoelectric conversion element PD, the first semiconductor layer 1, the second semiconductor layer 2, and the third semiconductor layer 3 may have a multi-layer structure. For example, as illustrated in FIG. 15, the first semiconductor layer 1 may have a two-layer structure including an amorphous Si layer 12 that is provided close to the second semiconductor layer 2 and an SiC layer 11 opposite to the second semiconductor layer 2. It is desirable that a hetero barrier formed at the interface between the SiC layer 11 and the amorphous Si layer 12 be so thin that a tunnel current flows, as described with reference to FIG. 29. In this case, it is possible to further reduce the dark current of the photoelectric conversion element PD while maintaining the affinity between the first semiconductor layer 1 and the second semiconductor layer 2.

As described above, a material for the first to third semiconductor layers 1 to 3 can include the same composite semiconductor. For instance, a material of the first and third semiconductor layers 1 and 3 can include Si or a composite semiconductor including Si.

A composition ratio of at least one of the first to third semiconductor layers 1 to 3, especially a composition ratio of the second semiconductor layer 2, is spatially modulated. Furthermore, the second semiconductor layer can have a multi-layer structure of semiconductor layers which are not necessarily including Si.

For example, the second semiconductor layer 2 may have a multi-layer structure including an $Si_{1-x}Ge_x$ layer 25, a Ge layer 24, an InSb layer 23, a Ge layer 22, and an $Si_{1-x}Ge_x$ layer 21 which are sequentially deposited from the third semiconductor layer 3 to the first semiconductor layer 1. In this case, it is possible to further improve the photoelectric conversion efficiency of the photoelectric conversion element PD per unit film thickness while maintaining the affinity between the second semiconductor layer 2 and the first and third semiconductor layers 1 and 3, which are the upper and lower semiconductor layers of the second semiconductor layer 2.

Figure 16:
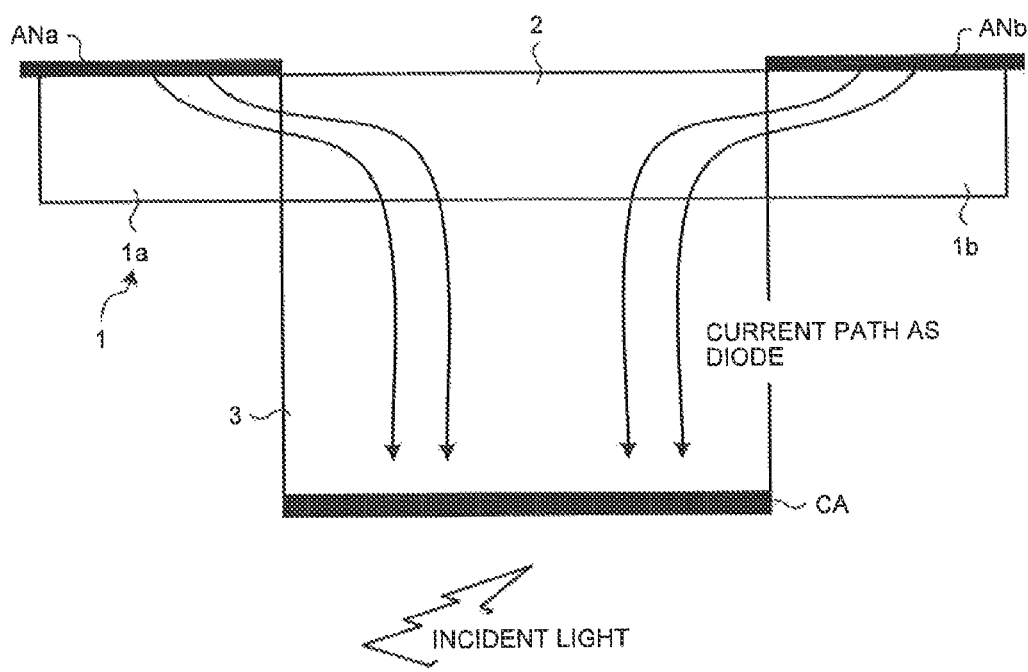
FIG. 16 is a diagram illustrating the structure of a photoelectric conversion element according to another modification of the embodiment.

Alternatively, for example, in the photoelectric conversion element PD, a current path from anode electrodes ANa and ANb to the cathode electrode CA may be divided into two or more directions. For example, in the photoelectric conversion element PD, as illustrated in FIG. 16, the first semiconductor layer 1 includes a first region 1a and a second region 1b. The first region 1a and the second region 1b are opposite to each other with the second semiconductor layer 2 interposed therebetween. The third semiconductor layer 3 is adjacent to a portion of the second semiconductor layer 2 between the first region 1a and the second region 1b. In this case, when charge to be read from the photoelectric conversion element PD is an electron, charges from the first region 1a and the second region 1b can be added and read in the third semiconductor layer 3. Alternatively, when the charge to be read from the photoelectric conversion element PD is a hole, charge in the third semiconductor layer 3 can be separately read from the first region 1a and the second region 1b.

Alternatively, as illustrated in FIG. 18, for example, in the photoelectric conversion element PD, the first semiconductor layer 1 may be a light incident side. Specifically, the solid-state imaging device SIS is, for example, a front side illumination (FSI) CMOS image sensor (see the type (b) in FIG. 28. For example, the first semiconductor layer 1 is the light incident side. For example, the first semiconductor layer 1 which is the light incident side is an n-type semiconductor layer, the second semiconductor layer 2 is an n-type semiconductor layer, and the third semiconductor layer 3 is a p-type semiconductor layer. That is, the first conductivity type is negative and the second conductivity type is positive. In this case, since the first-conductivity type minority carrier "1m" is a hole, "1m" is replaced with "p" indicating a hole. Since the first-conductivity type majority carrier "1M" is an electron, "1M" is replaced with "n" indicating an electron. Since the second-conductivity type minority carrier "2m" is an electron, "2m" is replaced with "n" indicating an electron. When the first-conductivity type dopant concentration $N_1$ is donor concentration, "$N_1$" is replaced with "$N_D$" indicating donor concentration. Since the second-conductivity type dopant concentration $N_2$ is accepter concentration, "$N_2$" is replaced with "$N_A$" indicating donor concentration. In this case, Expressions (8) and (9) become the following Expressions (22) and (23). That is, in the solid-state imaging device SIS, the following Expressions (22) and (23) are established:

$$D_{n3}/L_{n3} \times n_{i3}^2/N_A < D_{n2}/L_{n2} \times n_{i2}^2/N_A \qquad (22)$$

and $$D_{p1}/L_{p1} \times n_{i1}^2/N_D < D_{p2}/L_{p2} \times n_{i2}^2/N_D \qquad (23)$$

Alternatively, when the replacement is performed as described above, Expressions (10) and (11) become the following Expressions (24) and (24). In the solid-state imaging device SIS, the following Expressions (24) and (24) are established:

$$\sqrt{(\mu_{n3})} \times n_{i3}^2/N_A < (\mu_{n2}) \times n_{i2}^2/N_A \qquad (24)$$

and $$\sqrt{(\mu_{p1})} \times n_{i1}^2/N_D < (\mu_{p2}) \times n_{i2}^2/N_D \qquad (25)$$

In other words, in each photoelectric conversion element PD of the solid-state imaging device SIS, the material and structure of the second semiconductor layer 2 are configured so as to satisfy Expressions (22) and (23) or Expressions (24) and (24), from the relationship with the material and structure of the first semiconductor layer 1 or the material and structure of the third semiconductor layer 3. In this way, when the solid-state imaging device SIS is, for example, a front side illumination (FSI) CMOS image sensor, it is possible to improve the photoelectric conversion efficiency of the photoelectric conversion element PD per unit film thickness and reduce the dark current in the photoelectric conversion element PD.

FIGS. 1 and 18 illustrate an example in which the semiconductor layer on the light incident side is an n-type semiconductor layer in the photoelectric conversion element PD. However, in the photoelectric conversion element PD, the semiconductor layer on the light incident side may be a p-type semiconductor layer. That is, when the solid-state imaging device SIS is, for example, a back side illumination (BSI) CMOS image sensor, each photoelectric conversion element PD may be configured as illustrated in FIG. 18. Alternatively, when the solid-state imaging device SIS is, for example, a front side illumination (FSI) CMOS image sensor, each photoelectric conversion element PD may be configured as illustrated in FIG. 1.

Mounting Structure

Next, the mounting structure of the photoelectric conversion element PD according to the embodiment will be described with reference to FIGS. 19 to 23. FIGS. 19 to 23 are diagrams each illustrating the structure of a solid-state imaging device to which the photoelectric conversion element according to the embodiment is applied.

Figure 19:
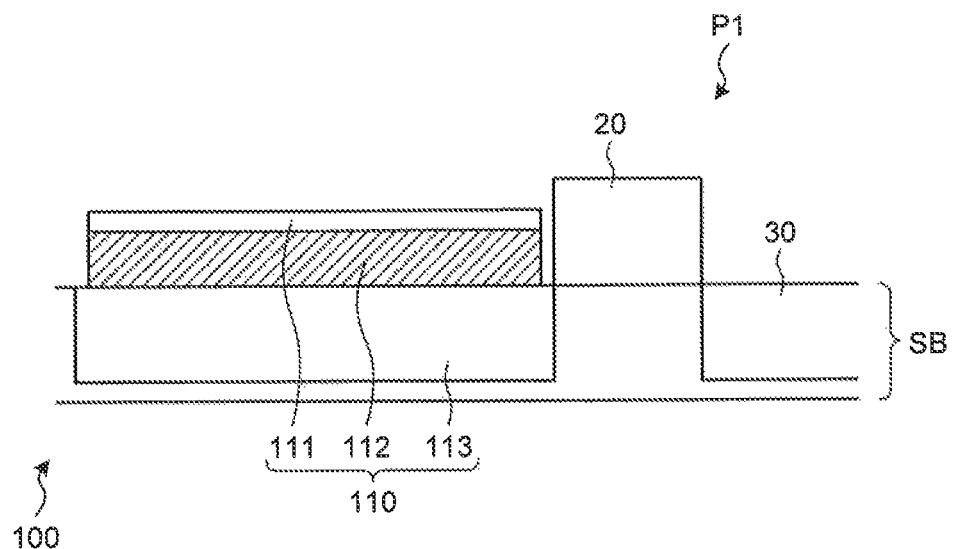
FIG. 19 is a diagram illustrating the structure of a solid-state imaging device to which the photoelectric conversion element according to the embodiment is applied.

In a solid-state imaging device 100 illustrated in FIG. 19, a plurality of pixels are one-dimensionally or two-dimensionally arranged. Next, a pixel P1 will be described as an example.

The pixel P1 of the solid-state imaging device 100 includes a photoelectric conversion element 110, a gate electrode 20, and a floating diffusion 30.

The photoelectric conversion element 110 includes a second-conductivity type semiconductor region 113 that is provided in a semiconductor substrate SB, a first-conductivity type semiconductor film 112 that is provided on the semiconductor substrate SB, and a first-conductivity type semiconductor film 111 that is provided on the semiconductor film 112. The semiconductor film 111, the semiconductor film 112, and the semiconductor region 113 correspond to the first semiconductor layer 1, the second semiconductor layer 2, and the third semiconductor layer 3 illustrated in FIG. 1 or FIG. 18, respectively.

The photoelectric conversion element 110 performs photoelectric conversion on incident light in a PN junction region, generates electrical charge corresponding to light, and accumulates the charge in, for example, the semiconductor region 113.

The gate electrode 20 is arranged on the semiconductor substrate SB so as to be adjacent to the photoelectric conversion element 110. The gate electrode 20 forms a transmission transistor together with the semiconductor region 113 of the photoelectric conversion element 110 and the floating diffusion 30. The transmission transistor is turned on when an active-level control signal is supplied to the gate electrode 20 and transmits charge accumulated in the photoelectric conversion element 110 (for example, the semiconductor region 113) to the floating diffusion 30.

The floating diffusion 30 is arranged in a well region of the semiconductor substrate SB. The floating diffusion 30 is made of a semiconductor which contains second-conductivity type dopants at a concentration higher than the dopant concentration of the well region. The floating diffusion 30 converts the charge transmitted by the transmission transistor into a voltage. An amplifying transistor (not illustrated) outputs a signal corresponding to the converted voltage to a signal line.

Figure 20:
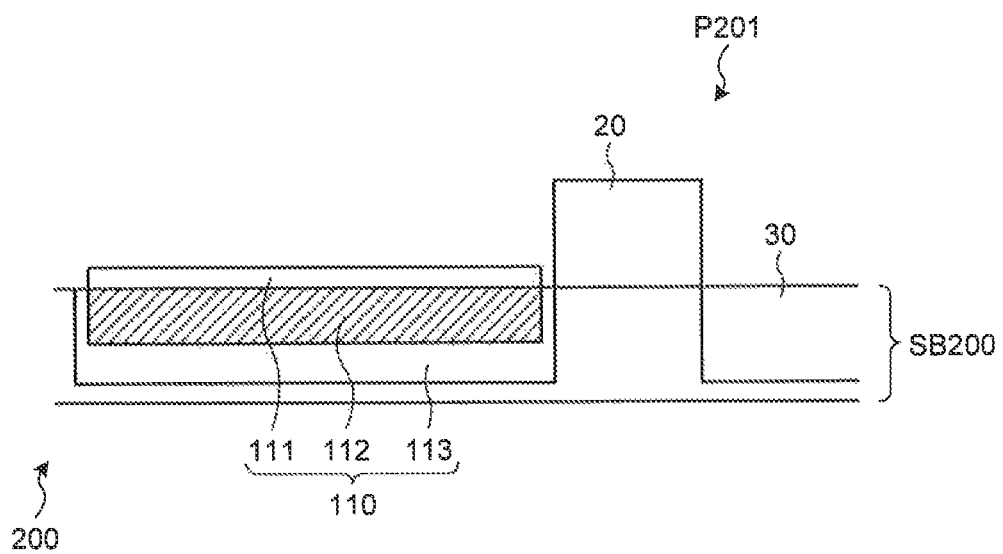
FIG. 20 is a diagram illustrating another structure of the solid-state imaging device to which the photoelectric conversion element according to the embodiment is applied.

A solid-state imaging device 200 illustrated in FIG. 20 differs from the solid-state imaging device 100 illustrated in FIG. 19 in that a semiconductor film 212 is provided in a semiconductor region 213 in a photoelectric conversion element 210 of a pixel P201 of the solid-state imaging device 200.

Figure 21:
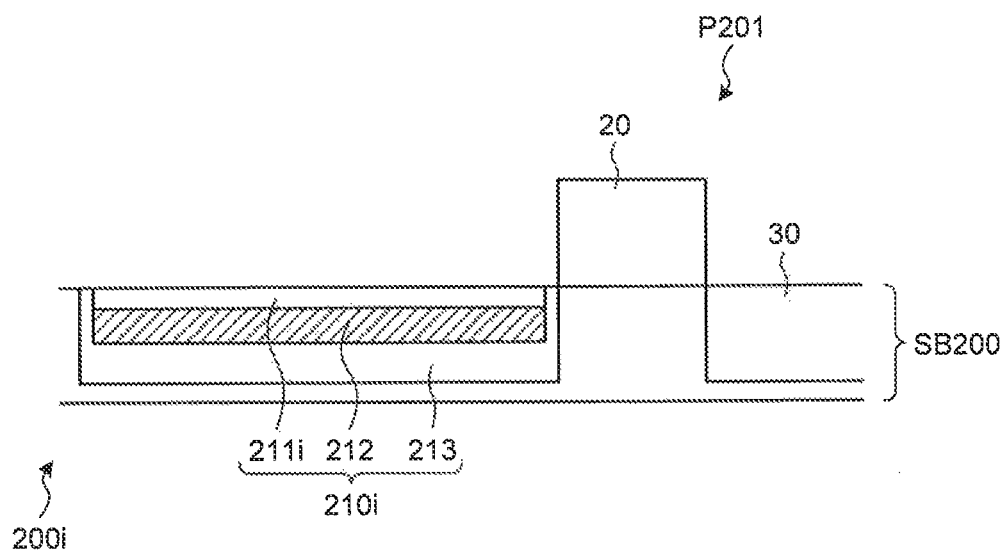
FIG. 21 is a diagram illustrating another structure of the solid-state imaging device to which the photoelectric conversion element according to the embodiment is applied.

A solid-state imaging device 200i illustrated in FIG. 21 differs from the solid-state imaging device 100 illustrated in FIG. 19 in that a semiconductor film 211i and the semiconductor film 212 are provided in the semiconductor region 213 of a photoelectric conversion element 210i of a pixel P201 of the solid-state imaging device 200i.

Figure 22:
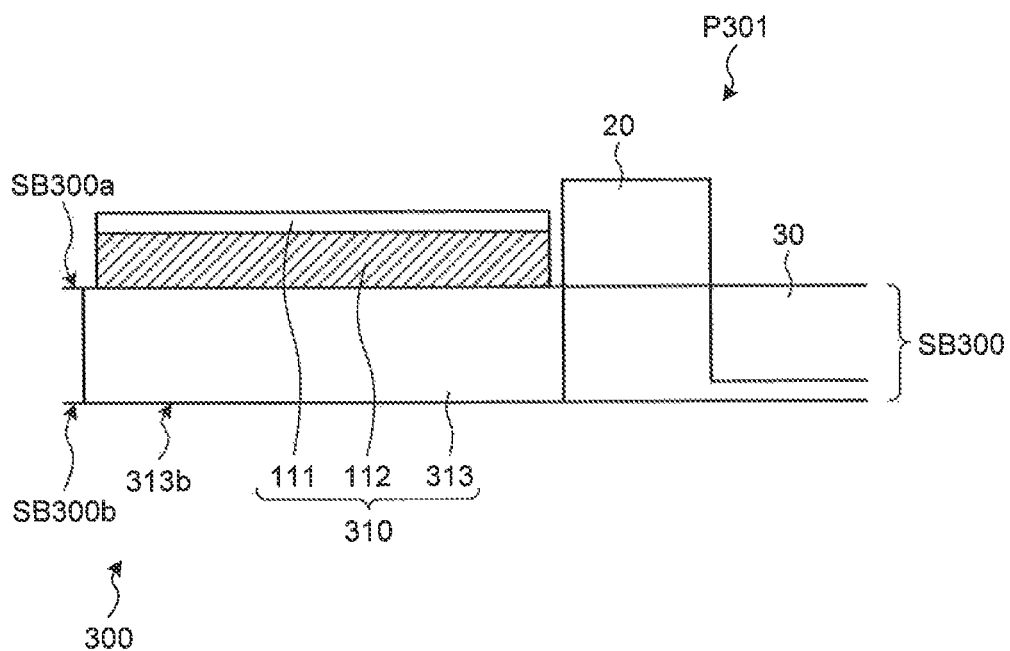
FIG. 22 is a diagram illustrating another structure of the solid-state imaging device to which the photoelectric conversion element according to the embodiment is applied.

A solid-state imaging device 300 illustrated in FIG. 22 differs from the first embodiment in that a lower surface 313b of a semiconductor region 313 in a photoelectric conversion element 310 of a pixel P301 of the solid-state imaging device 300 forms a portion of a rear surface SB300b of a semiconductor substrate SB300. That is, the semiconductor region 313 is exposed from both the front, surface SB300a and the rear surface SB300b of the semi conductor substrate SB300. In other words, the semiconductor substrate SB300 is thinned and the thickness of the semiconductor substrate SB300 is reduced to the thickness of the semiconductor region 313.

Figure 23:
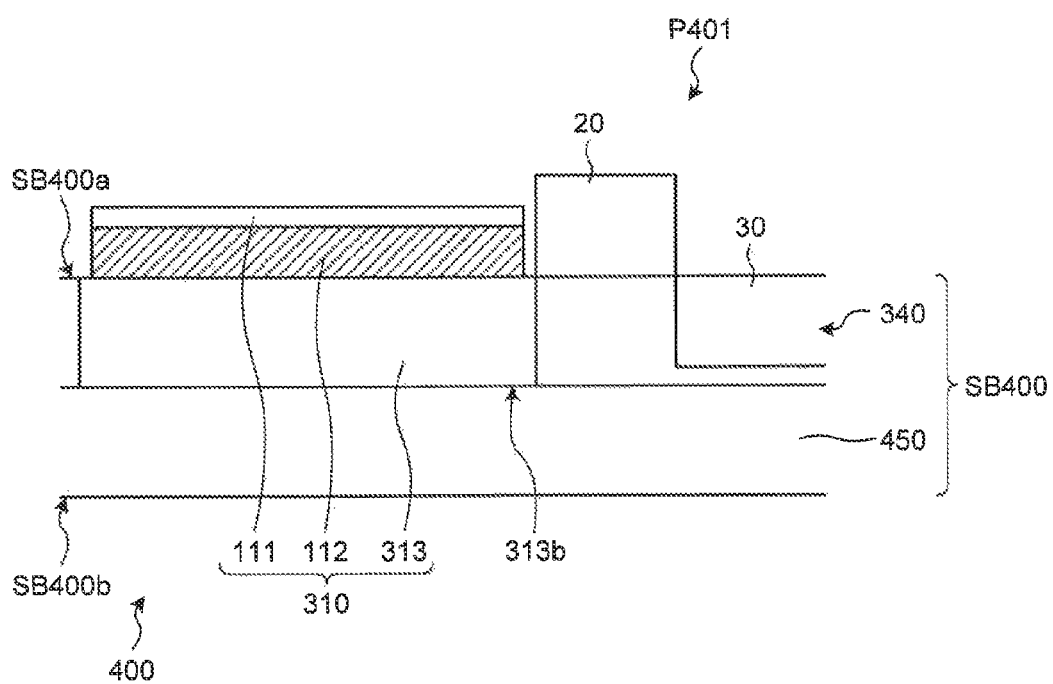
FIG. 23 is a diagram illustrating another structure of the solid-state imaging device to which the photoelectric conversion element according to the embodiment is applied.

A solid-state imaging device 400 illustrated in FIG. 23 differs from the solid-state imaging device 300 illustrated in FIG. 22 in that the lower surface 313b of the semiconductor region 313 in the photoelectric conversion element 310 of a pixel P401 of the solid-state imaging device 400 comes into contact with a buried oxide layer 450 of a semiconductor substrate SB400. That is, the semiconductor substrate SB400 includes a front surface SB400a that is arranged in an active region 340 and a rear surface SB400b from which the buried oxide layer 450 is exposed.

In addition, considering that the use of an electron rather than a hole, as the charge to be transmitted by the transmission transistor makes it possible to increase the operation speed of the transmission transistor, in the mounting structure in which the second semiconductor layer is provided on the third semiconductor layer as illustrated in FIGS. 19, 22, and 23, it is easy to extract charge accumulated in the third semiconductor layer. Therefore, it is preferable that each photoelectric conversion element PD have the structure illustrated in FIG. 1. Alternatively, as illustrated in FIGS. 20 and 21, in the mounting structure in which the second semiconductor layer is provided in the third, semiconductor layer, it is easy to extract charge accumulated in the second semiconductor layer. Therefore, it is preferable that each photoelectric conversion element PD have the structure illustrated in FIG. 18.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a photoelectric converter including:
  a first semiconductor layer of a first conductivity type;
  a second semiconductor layer of the first conductivity type that is provided adjacent to the first semiconductor layer; and
  a third semiconductor layer of a second conductivity type opposite to the first conductivity type that is provided adjacent to the second semiconductor layer,
the second semiconductor layer being formed of a material with an absorption coefficient for visible light greater than that of a material forming the third semiconductor layer,
a relation of $D_{2m3}/L_{2m3} \times n_{i3}^2/N_2 < D_{1M2}/L_{1M2} \times n_{i2}^2/N_2$ and a relation of $D_{1m1}/L_{1m1} \times n_{i1}^2/N_1 < D_{1m2}/L_{1m2} \times n_{i2}^2/N_1$ being established where a diffusion coefficient of a minority carrier in the first semiconductor layer is $D_{1m1}$, a diffusion length of the minority carrier in the first semiconductor layer is $L_{1m1}$, an intrinsic carrier concentration in the first semiconductor layer is $n_{i1}$, a dopant concentration in the first semiconductor layer is $N_1$, a diffusion coefficient of the minority carrier in the second semiconductor layer is $D_{1m2}$, a diffusion coefficient of a majority carrier in the second semiconductor layer is $D_{1M2}$, a diffusion length of the minority carrier in the second semiconductor layer is $L_{1m2}$, a diffusion length of the majority carrier in the second semiconductor layer is $L_{1M2}$, an intrinsic carrier concentration in the second semiconductor layer is $n_{i2}$, a diffusion coefficient of the minority carrier in the third semiconductor layer is $D_{2m3}$, a diffusion length of the minority carrier in the third semiconductor layer is $L_{2m3}$, an intrinsic carrier concentration in the third semiconductor layer is $n_{i3}$, and a dopant concentration in the third semiconductor layer is $N_2$.

2. The device according to claim 1, wherein
in the photoelectric converter, when the second semiconductor layer is formed in the third semiconductor layer, the first conductivity type is negative and the second conductivity type is positive, and
when the second semiconductor layer is formed on the third semiconductor layer, the first conductivity type is positive and the second conductivity type is negative.

3. The device according to claim 1, wherein a material of the first to third, semiconductor layers includes the same composite semiconductor while a composition ratio of at least one of the first to third semiconductor layers is spatially modulated.

4. The device according to claim 1, wherein a material of the first and third semiconductor layers includes Si or a composite semiconductor including Si, and the second semiconductor layer has a multi-layer structure of semiconductor layers.

5. The device according to claim 1, wherein
the material of the second semiconductor layer has a bandgap smaller than that of the material of the first semiconductor layer and smaller than that of a material of the third semiconductor layer.

6. The device according to claim 5, wherein
the bandgap of the material of the first semiconductor layer is equal to the bandgap of the material of the third semiconductor layer.

7. The device according to claim 6, wherein a material of the first and third semiconductor layers is Si or amorphous Si, and a material of the second semiconductor layer is SiGe.

8. The device according to claim 6, wherein
a material of the first and third semiconductor layers is an amorphous Si,
a material of the second, semiconductor layer is SiGe, and
the first and third semiconductor layers are formed by implanting ions into monocrystal Si layers.

9. The device according to claim 1, wherein
the first semiconductor layer includes:
a first region that is adjacent to the second semiconductor layer; and
a second region that is adjacent to the second semiconductor layer on a side opposite to the first region, and
the third semiconductor layer is adjacent to a portion of the second semiconductor layer between the first region and the second region.

10. The device according to claim 1, wherein
the second semiconductor layer has a first main surface and a second main surface opposite to the first main surface,
the first semiconductor layer is provided on the first main surface,
the third semiconductor layer is provided on the second main surface,
in the photoelectric converter, a dopant profile of a first-conductivity type dopant gradually rises toward the first semiconductor layer and becomes flat in the first semiconductor layer.

11. The device according to claim 1, wherein
a relation of $TH_1 > \sqrt{(k_B T/q)\mu_{1m1}\tau_{1m1}}$ is satisfied where a thickness of the first semiconductor layer is $TH_1$, a Boltzmann constant is $k_B$, an elementary charge amount is q, an operation temperature of the solid-state imaging device is T, a mobility of the minority carrier in the first semiconductor layer is $\mu_{1m1}$, and a momentum relaxation time of the minority carrier in the first semiconductor layer is $\tau_{1m1}$.

* * * * *